(12) United States Patent
Ansell

(10) Patent No.: US 10,813,428 B1
(45) Date of Patent: Oct. 27, 2020

(54) TWO COMPONENT PROGRAMMABLE MODULAR SYSTEM AND METHOD OF USING THE SAME

(71) Applicant: Debra Ansell, Los Angeles, CA (US)

(72) Inventor: Debra Ansell, Los Angeles, CA (US)

(*) Notice: Subject to any disclaimer, the term of this patent is extended or adjusted under 35 U.S.C. 154(b) by 0 days.

(21) Appl. No.: 16/427,342

(22) Filed: May 31, 2019

(51) Int. Cl.
| | |
|---|---|
| A45C 15/06 | (2006.01) |
| H05K 1/18 | (2006.01) |
| H05K 7/14 | (2006.01) |
| A45F 3/04 | (2006.01) |
| A45C 3/06 | (2006.01) |
| H05B 45/37 | (2020.01) |
| H05B 47/19 | (2020.01) |
| H05B 47/105 | (2020.01) |
| A45F 3/00 | (2006.01) |

(52) U.S. Cl.
CPC ............... *A45C 15/06* (2013.01); *A45C 3/06* (2013.01); *A45F 3/04* (2013.01); *H05B 45/37* (2020.01); *H05B 47/105* (2020.01); *H05B 47/19* (2020.01); *H05K 1/181* (2013.01); *H05K 7/1427* (2013.01); *A45F 2003/003* (2013.01); *H05K 2201/10022* (2013.01); *H05K 2201/10037* (2013.01); *H05K 2201/10106* (2013.01); *H05K 2201/10151* (2013.01)

(58) Field of Classification Search
CPC ..... A61B 5/6801; A61B 5/6803; A61B 5/681; A61B 5/0008; A61B 5/02427; A61B 5/02438; A61B 2560/0431; A61B 2560/0443; A45F 5/00; A45F 2005/008; A45F 3/04; A45F 2003/003; H05B 33/0842; H05B 33/0845; H05B 33/0863; H05B 33/0872; H05B 37/02; H05B 37/0227; H05B 37/0272; H05B 37/0281; H05B 45/37; H05B 47/19; H05B 47/105; A45C 15/06; A45C 3/06; H05K 1/181; H05K 7/1427; H05K 2201/10037
See application file for complete search history.

(56) References Cited

U.S. PATENT DOCUMENTS

| | | | | |
|---|---|---|---|---|
| 9,183,719 | B2* | 11/2015 | Gouge | A61B 5/01 |
| 9,371,986 | B2* | 6/2016 | Nelson | F21V 33/0008 |
| 9,663,025 | B2* | 5/2017 | Drexler | B60Q 1/26 |
| 10,079,264 | B2* | 9/2018 | Zhang | H01L 27/156 |
| 10,321,541 | B2* | 6/2019 | Bora | H05B 33/0842 |
| 10,643,528 | B2* | 5/2020 | Selan | G09G 3/3426 |
| 2006/0227538 | A1* | 10/2006 | Williams | A45C 15/06 362/155 |
| 2015/0022099 | A1* | 1/2015 | Farley | G06F 16/24 315/161 |

* cited by examiner

*Primary Examiner* — Haissa Philogene
(74) *Attorney, Agent, or Firm* — Treasure IP Group, LLC

(57) ABSTRACT

The present invention is directed to programmable LED handbags/wearables that contain a custom PCB with RGB LEDs with optional sensors. These PCBs display customizable colors/patterns in response to modifiable computer code, signals from other programmable LED handbags/wearables, and/or the input from the surrounding environment. These PCBs are attached to the bag with detachable fasteners to they may be easily accessed for programming, or removed to be placed in a different wearable item. Detachable fasteners and positioning element provide alignment/prevent displacement between the orifices in the wearables and LEDs on the PCB.

23 Claims, 29 Drawing Sheets

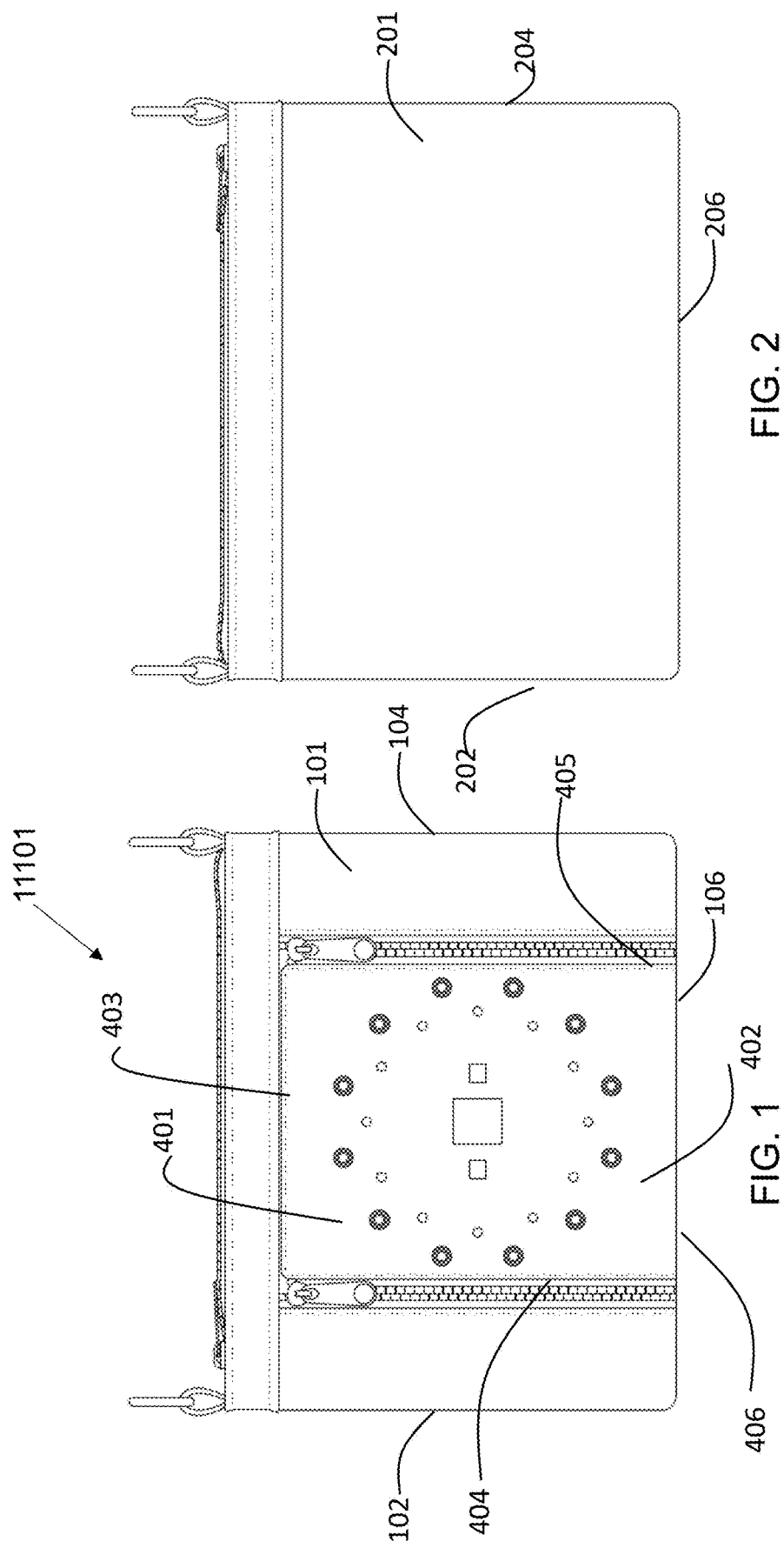

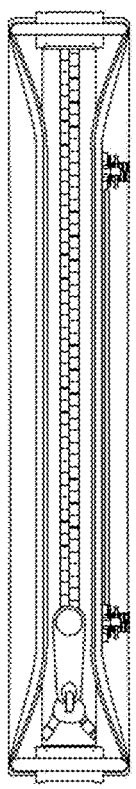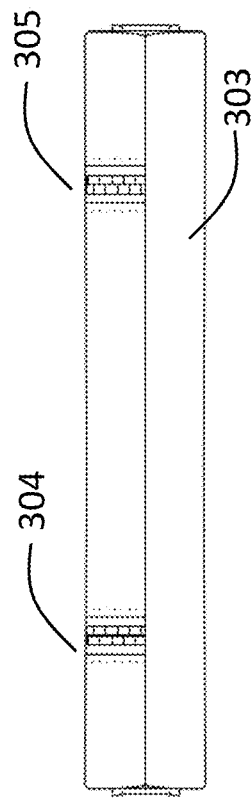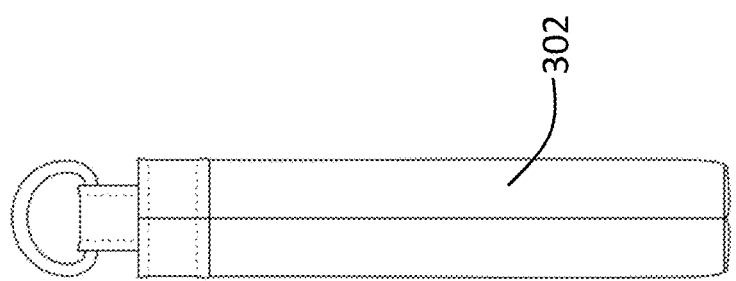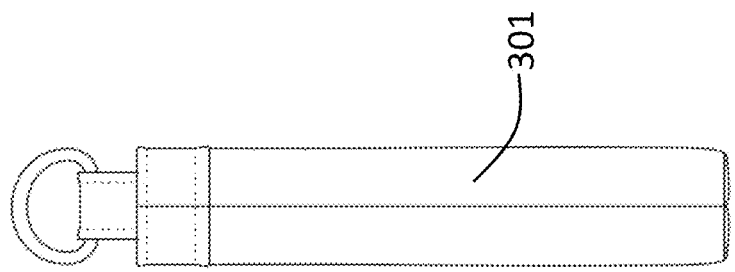
FIG. 5
FIG. 6
FIG. 4
FIG. 3

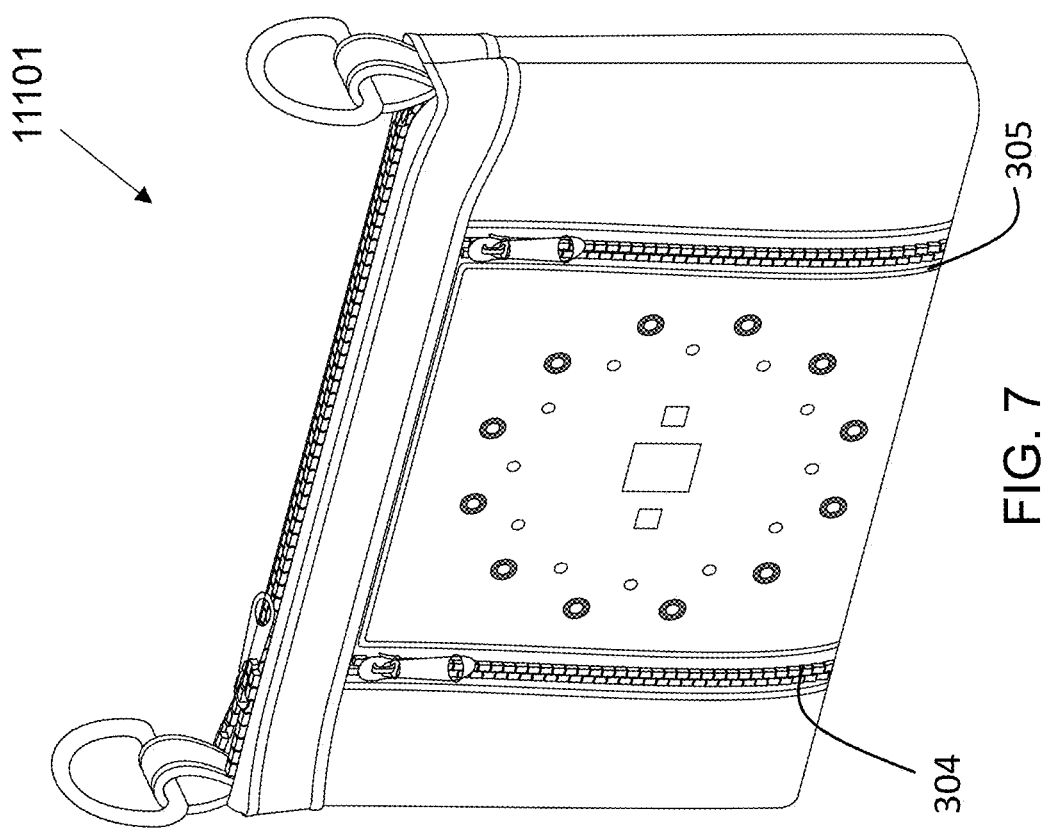

*Power flow from the battery through the PCB and microcontroller*

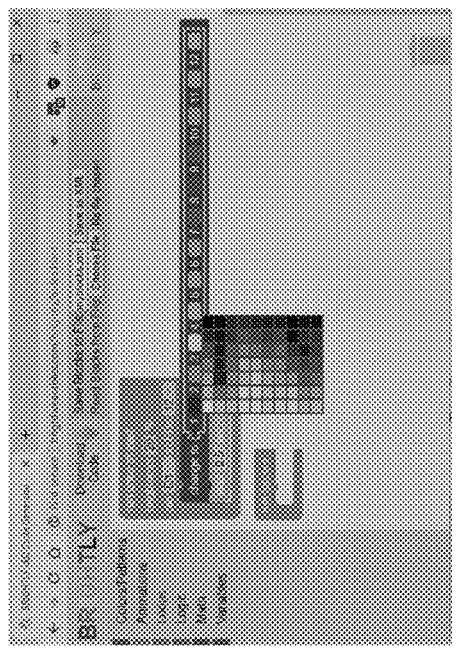
FIG. 43a
FIG. 43b
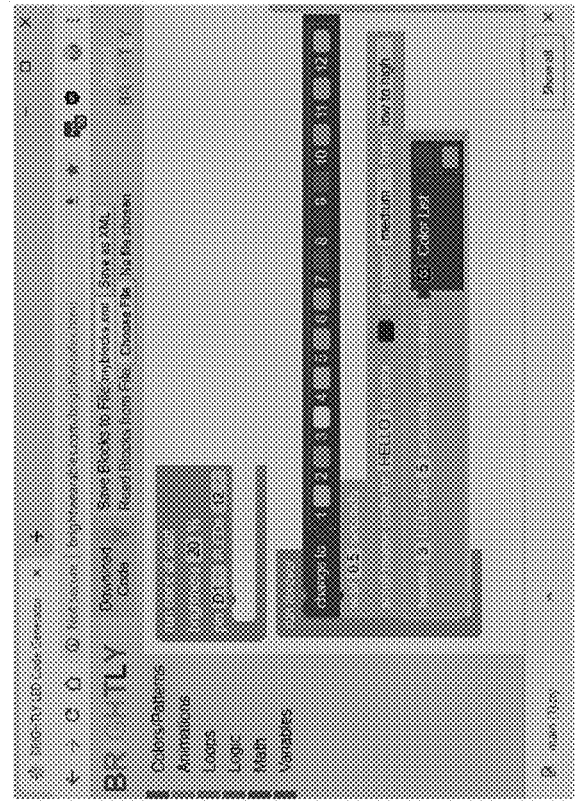
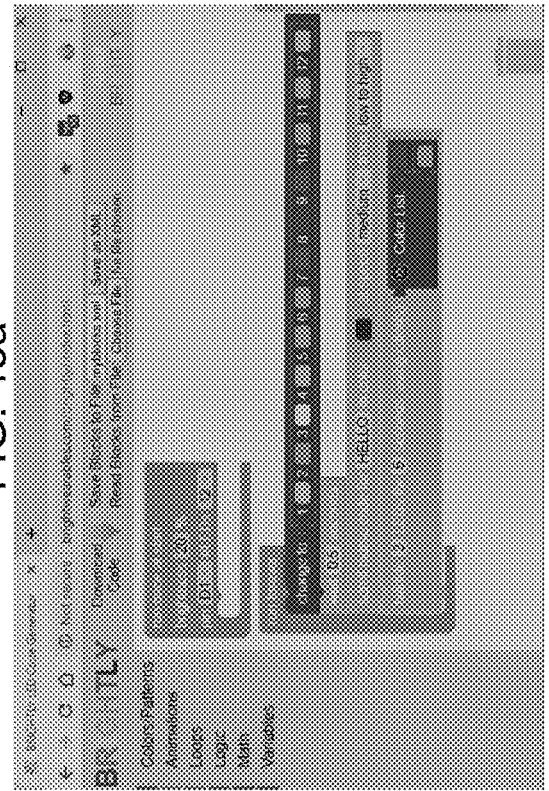
FIG. 43c
FIG. 43d

TWO COMPONENT PROGRAMMABLE MODULAR SYSTEM AND METHOD OF USING THE SAME

TECHNICAL FIELD

The present invention relates to a modular illumination system that can be incorporated into a broad variety of wearable items for educational, entertainment, social, and aesthetic purposes. More particularly, the invention is directed to programmable LED Handbag/Wearables containing removable but precisely positionable electrical components, for example a printed circuit board.

BACKGROUND OF THE INVENTION

LEDs have been widely used in a variety wearable items for illumination, entertainment or personal safety purposes. RGB LEDs can display customizable color patterns in response to programmable instructions, further making the adoption of LEDs in interactive toys more appealing.

Computer programming is an essential skill for engineers and becoming important for non-engineers as well, in our rapidly developing modem technological society. As technology increases in complexity, so will the demand for those with programming skills. Many toys or educational tools have been invented to promote and teach coding and logic to school-age children. However, these toys or educational tools are more attractive to boys than girls. As a result, boys have more early exposure to programming skills because "boys'" toys are much more likely to contain embedded technology than "girls'" toys. So, there is a need to create an educational article that is readily accessible and attractive to children and adults of both genders.

Though electronics are ubiquitous in society today, most individuals are intimidated by the idea of creating and designing their own electronic items. Electronic and programming skills are considered an advanced skill set requiring much time and education to master. People are afraid to tinker with their electronic items for fear of breaking them. This makes integrating objects with electronic components or programmable components very difficult or even prohibitive to kids, young students, designers, non-engineers, and others lacking necessary experience. Therefore, a simple, intuitive, and easy to use educational article utilizing programmable hardware in an appealing and accessible fashion can help to overcome those reservations. The innate portability and visual appeal of a programmable wearable item allows the owner to transport, share and display their newly learned skills to the outside world. Additionally, the possibility of programming a wearable item to interact with other similar items in the vicinity provides a social incentive to learn these skills.

In view of the foregoing, there is a need for a simple educational system which integrates programmable electronics into an appealing and familiar everyday item. The assimilation of accessible and customizable technology into wearables provides a gateway to understand the interaction of coding and electronics with the everyday world, and introduces the fundamental skills needed to interact with programmable electronics in a fun, social, and visually appealing fashion.

SUMMARY OF THE INVENTION

The present invention is directed to programmable LED handbags and/or wearables that contain a custom PCB with RGB LEDs and optional sensors. These PCBs display customizable colors/patterns in response to modifiable computer code, signals from other programmable LED handbags/wearables, and/or the input via sensors from the surrounding environment. These PCBs are attached to the bag with detachable fasteners so they may be easily accessed for programming, or removed to be placed in a different wearable item.

The present invention describes a two-component intelligent carrying device, which includes a device body and a programmable electronic assembly, and method of using the same and method of interacting the same.

It is one object of the present invention to provide a "modular" system containing one or more easily removable programmable electronic assemblies, for example a PCB. The PCB is held in place by detachable fasteners which maintain its desired position with minimal dislocation, and allow the PCB to be easily removed when necessary. Such a modular system can be integrated into one or more different wearable products containing orifices aligned with the LEDs mounted on the PCB so that the body of the PCB is hidden while the light emitted from the LEDs is visible.

It is another object of the present invention that the modular system can display custom LED patterns and to interact with the surrounding environment using sensors, Bluetooth, etc. Wearable articles having the modular system can be programmed to interact with each other, and detect and respond to information from the environment.

In accordance with the disclosure of the present invention, in a first primary aspect, disclosed herein, is a two-component intelligent portable carrying apparatus.

According to the first primary aspect of the present invention, a modular system is described. In a first aspect of variations of the modular system, the two-component intelligent portable carrying apparatus comprises a portable carrying apparatus comprising one or more interior walls and one or more exterior walls, wherein the interior walls are connected to form a semi-enclosed area, having a top or side opening, and the two-component intelligent portable carrying apparatus is configured to contain items.

In one embodiment of the first aspect of variations of the present invention, the intelligent portable carrying apparatus is a handbag.

In another embodiment of the first aspect of variations of the present invention, the intelligent portable carrying apparatus is a backpack.

In accordance with the teachings of the present invention, disclosed herein, the two-component intelligent portable carrying apparatus, in a second aspect of variations of the modular system, is a handbag or a backpack which can be of any shape.

In one embodiment of the second aspect of variations, the two-component intelligent portable carrying apparatus has a front panel. The front panel may further comprise left and right side edges and one bottom edge.

In another embodiment of the second aspect of variations, the two-component intelligent portable carrying apparatus does not have a clearly defined front panel with identifiable edges, but at least one portion of a surface of the two-component intelligent portable carrying apparatus is flat in one in-use configuration.

In accordance with the teachings of the present invention, disclosed herein, the two-component intelligent portable carrying apparatus, in a third aspect of variations of the modular system, a flat compartment is provided to the carrying apparatus. The flat compartment has an exterior surface and interior surface, configured to receive a detachable Printed Circuit Board (PCB) assembly between the exterior and interior surfaces. Further, the exterior surface has a first edge, a second edge, a third edge and fourth edge, and the four edges are connected together circumferentially define an exterior surface of the flat compartment. Additionally, the exterior surface of the flat compartment is permanently fixed to one of the exterior walls of the portable carrying apparatus by the fourth edge of the exterior surface. The second edge of the flat compartment is releasably attached to the one of the exterior walls of the portable carrying apparatus of the portable carrying apparatus by means of a second connecting member, and the third edge of the flat compartment is releasably attached to one of the exterior walls of the portable carrying apparatus by means of a third connecting member, the second connecting member and the third connecting member are configured to allow the exterior surface of the flat compartment to form an adjustable angle with one of the exterior walls of the portable carrying apparatus, intermittently or continuously at least between 0-180 degrees.

Additionally, in some variations, the exterior surface of the flat compartment is provided with a plurality of orifices. The plurality of orifices is adapted to receive or expose surface features of the PCB assembly, and said surface features are selected from a plurality of LEDs disposed on a first surface of a PCB board.

In one embodiment of the third aspect of variations of the modular system, the interior surface of the flat compartment, is attached to the exterior surface of the flat compartment. The interior surface of the flat compartment moves with the exterior surface of the flat compartment.

In another embodiment of the third aspect of variations of the modular system, the interior surface of the flat compartment, is sandwiched in between exterior wall and its corresponding interior wall of the portable carrying apparatus, but it is separated from the exterior surface of the flat compartment. The interior surface of the flat compartment does not move with the exterior surface of the flat compartment when it opens or closes with respect to the semi-enclosed area formed by the interior walls, or equivalents thereof. Instead, in one example, the interior surface of the flat compartment is disposed on a surface of interior wall of the portable carrying apparatus.

In accordance with the teachings of the present invention, disclosed herein, the two-component intelligent portable carrying apparatus, in a fourth aspect of variations of the modular system, comprises a PCB assembly. The interior surface of the flat compartment has a cavity to accommodate the printed circuit board (PCB) element in the PCB assembly. The PCB element is secured in the flat compartment by means of a first attachment member and a second attachment member, each having complimentary joining members on a second surface of the PCB element and the interior surface of the flat compartment. More importantly, the PCB element has the plurality of LEDs in a first arrangement, a programmable control element or micro-controller, configured to send operable instructions to the LEDs on the PCB board. Optionally, the programmable control element or micro-controller have a plurality of LEDs in a second arrangement. The PCB assembly further include a detachable battery assembly connected a connection on the PCB element.

In one embodiment of the fourth aspect of variations of the modular system, programmable control element or micro-controller is detachable from the PCB element. And one PCB element may have a connector allowing it to accommodate multiple different microcontrollers.

In another embodiment of the fourth aspect of variations of the modular system, programmable control element or micro-controller is integrated onto the PCB element. And the PCB element and the microcontroller work together as a one-to-one correspondence pair.

Additionally, and optionally, in some embodiment of the fourth aspect of variations, the PCB assembly further comprises environmental sensors.

In an additional fourth aspect of variations, the PCB assembly contain either a built-in or detachable microcontroller, or the flat compartment is configured to receive the PCB element alone.

In accordance with the teachings of the present invention, disclosed herein, the two-component intelligent portable carrying apparatus, in a fifth aspect of variations of the modular system, the interior surface of the flat compartment is either connected or not connected to the interior wall of the portable carrying apparatus, but the interior surface of the flat compartment are secured to the exterior surface of the flat compartment by means of a positioning element, which is configured to substantially eliminate the relative displacement between the exterior surface and the interior surface of the flat compartment.

In one embodiment of the fifth aspect of variations of the modular system, the positioning element to secure the exterior surface and interior surface of the flat compartment is stitches. The stitches may be arranged in a simple or an artistic, random or regular layout to add aesthetic value.

In one embodiment of the fifth aspect of variations of the modular system, the positioning element to secured the exterior surface and interior surface of the flat compartment is a hardware fastener assembled through pre-punched holes.

According to a second primary aspect of the present invention, disclosed herein, is a method of using of the two-component intelligent portable carrying apparatus described above.

In accordance with the teachings of the present invention, disclosed herein, in a seventh aspect of variations, the a method of using of the two-component intelligent portable carrying apparatus comprises, providing LEDs in a first arrangement onto a PCB element, placing a PCB assembly into a modular system, wherein PCB element connects, regulates and transforms power input from a power supply, and distributes it to the individually addressable LEDs and a programmable control element; and the PCB element provides a connection for data signals to travel from the programmable control element to the individually addressable LEDs. In one example, the programmable control element is a microcontroller.

Further, a power source supplies the energy to the microcontroller and LED through PCB.

Generally, in most embodiments, the method of the using modular system described above further comprising taking input information and sending a control signal to level shifting circuit of the PCB element by a programmable control element, sending level shifting circuit output signal to an illuminating element, including a plurality of addressable LEDs. In the present invention, the input information may be generated by a human or computer-generated program, sensor, smart phone or other remote control device. In the present invention, in some examples, the LEDs in illuminating element are linked sequentially whereas in another examples, the LEDs in illuminating element are linked parallel.

Additionally, or preferably, in some embodiments, the PCB element further comprises sensors. Correspondingly, the method further comprises a step of detecting information from the environment by a sensor or sensors on the PCB and sending the information to the programmable control element subsequently level shifting circuit of the PCB element.

Alternatively, or optionally, in some embodiments, the programmable control element further comprises sensors. Correspondingly, the method further comprises a step of detecting information from the environment by a sensor or sensors on the programmable control element and sending the information to the programmable control element subsequently to the level shifting circuit of the PCB element.

According to a third primary aspect of the present invention, disclosed herein, is a method of interacting with the two-component intelligent portable carrying apparatus described above. In general, a user may interact with the PCB assembly in the two-component intelligent portable carrying apparatus in two primary ways. In one embodiment of the third aspect of the present invention, the method of how a user interacts with the portable carrying apparatus is by programming the microcontroller. In another embodiment of the third aspect of the present invention, the method of how user interacts with the portable carrying apparatus is by interacting directly with any sensors contained on the microcontroller or PCB. The interaction method offered by the present invention, allowing a user to adjust illumination patterns/colors/brightness of the LEDs in the illumination elements.

BRIEF DESCRIPTION OF THE DRAWINGS

Non-limiting examples of various aspects and variations of the invention are described herein and illustrated in the accompanying drawings.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents that can be included within the spirit and scope of the described embodiments as defined by the appended claims.

FIG. 1: illustrates a front view of one embodiment of the present invention, the embodiment (111011) is bag having a front panel and the front panel having a compartment, and the front panel is in a closed configuration, in accordance with the aspects of the present invention;

FIG. 2: illustrates a back view of the embodiment (11101) of the present invention, in accordance with the aspects of the present invention;

FIG. 3: illustrates a left sideview of the embodiment (11101) of the present invention, in accordance with the aspects of the present invention;

FIG. 4: illustrates a right sideview of the embodiment (11101) of the present invention, in accordance with the aspects of the present invention;

FIG. 5: illustrates a top view of the embodiment (11101) of the present invention, in accordance with the aspects of the present invention;

FIG. 6: illustrates a bottom view of the embodiment (11101) of the present invention, in accordance with the aspects of the present invention;

FIG. 7: illustrates a perspective view of the embodiment (11101) of the present invention, in accordance with the aspects of the present invention;

FIG. 43*a*-FIG. 43*d* are illustrative user interface of programming. (same as above)

DETAILED DESCRIPTION OF EXAMPLE EMBODIMENTS

Figure 9:
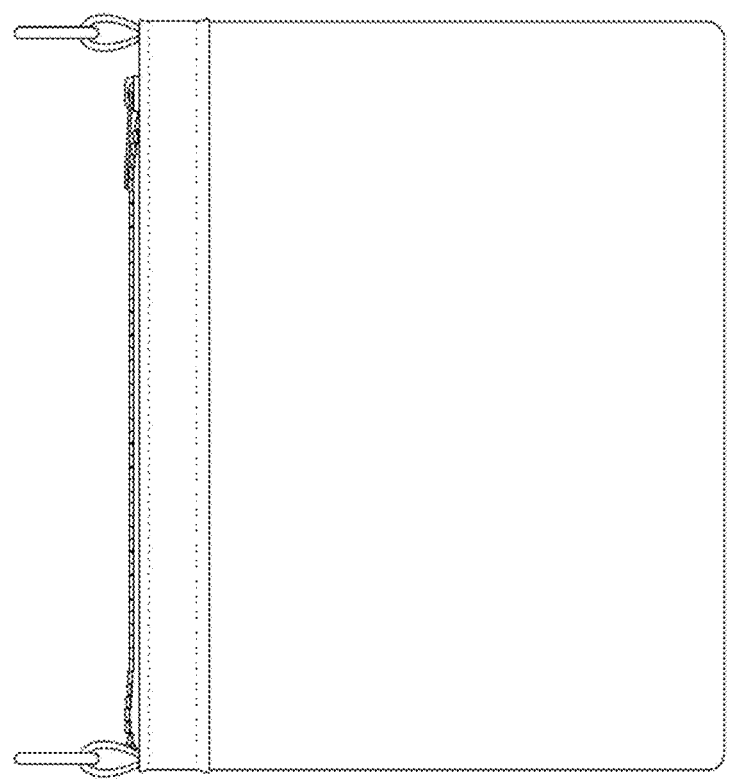
FIG. 9: illustrates a back view of the embodiment (11101) of FIG. 8, in accordance with the aspects of the present invention.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents that can be included within the spirit and scope of the described embodiments as defined by the appended claims.

The present invention is directed to a modular system, which is a programmable LED carrying apparatus, for example programmable LED handbags/wearables that contain a custom PCB with RGB LEDs. Optional sensors may be included in either the PCB element or a microcontroller. The system further includes LEDs which display customizable colors/patterns in response to modifiable computer code, signals from other programmable LED handbags/wearables, and/or the input from the surrounding environment. One key aspect of the invention is that the PCBs are attached to the bag with detachable fasteners so that they may be easily accessed for programming, or removed to be placed in a different wearable item.

In the first aspect of the invention, the modular system is described in detail. In the second aspect of the invention, a method to use the modular system is described in detail. In the third aspect of the invention, a method to interact with the modular system is described in detail.

According to a first aspect of the present invention, the modular system is described. The modular system comprises an apparatus body, for example, a bag or other wearable item, a removable electronic component assembly, for example a PCB assembly, including an either removable microcontroller or a built-in microcontroller. The electronic component assembly may further include optional sensors.

In a first aspect of variations of the modular system, the two-component intelligent portable carrying apparatus comprises a portable carrying apparatus comprising an apparatus body. The apparatus body have one or more interior walls and one or more exterior walls. The interior walls of the are connected to form a semi-enclosed area, having a top or side opening, and the two-component intelligent portable carrying apparatus is configured to contain items.

The two-component intelligent carrying apparatus in the present invention is a wearable item. One goal of present invention is that the two-component intelligent carrying apparatus is configured to be light enough to be easily transferred from place to place for social, educational, or entertainment purposes. Generally, the bag can be made of leather or fabric, with weight ranging is from 8 oz to 16 oz. To allow for variations in battery size, fabric weight, different decorative materials in the system (e.g. metal chain strap), we define a weight range from a lower bound of 4 oz to a few pounds, for example, 5 pounds.

In some alternatives, the two-component intelligent carrying apparatus in the present invention can also be an emergency medical case or a suitcase. In this case the weight of the suitcase can be heavier than a few pounds.

In accordance with the teachings of the present invention, disclosed herein, the two-component intelligent portable carrying apparatus, in a second aspect of variations of the modular system, is a handbag or a backpack which can be of any shape.

In a first embodiment of the first aspect of variations of the present invention, the intelligent portable carrying apparatus is a handbag. The apparatus body is a body of the bag. The bag has at least a front panel. Optionally, the bag further has a back panel, and bottom panel.

In a first example, the modular system is part of a handbag as shown in FIGS. 1-7. The handbag 1101 as shown has a front panel 101, a back panel 201, a left side panel 302, a right side panel and a bottom panel 303. The front panel 101 further has a left side edge (102), right side edge (104) and bottom edge 106. The back panel 201 has a left side edge 201, right side edge 204 and one bottom edge 206. The front panel 101 and back panel 201 are configured to be joined together through side edges (102, 104, 202 and 204) and bottom edges (106 and 206), to form a semi-enclosed area having a top opening, and the apparatus body is configured to withhold items.

Alternatives, in a variation from the first example, the front panel and back panel are joined together in the absence of side panels. Similarly, in another variation from the first example, the front panel and back panel are joined together in the absence of the bottom panel.

Figure 20:
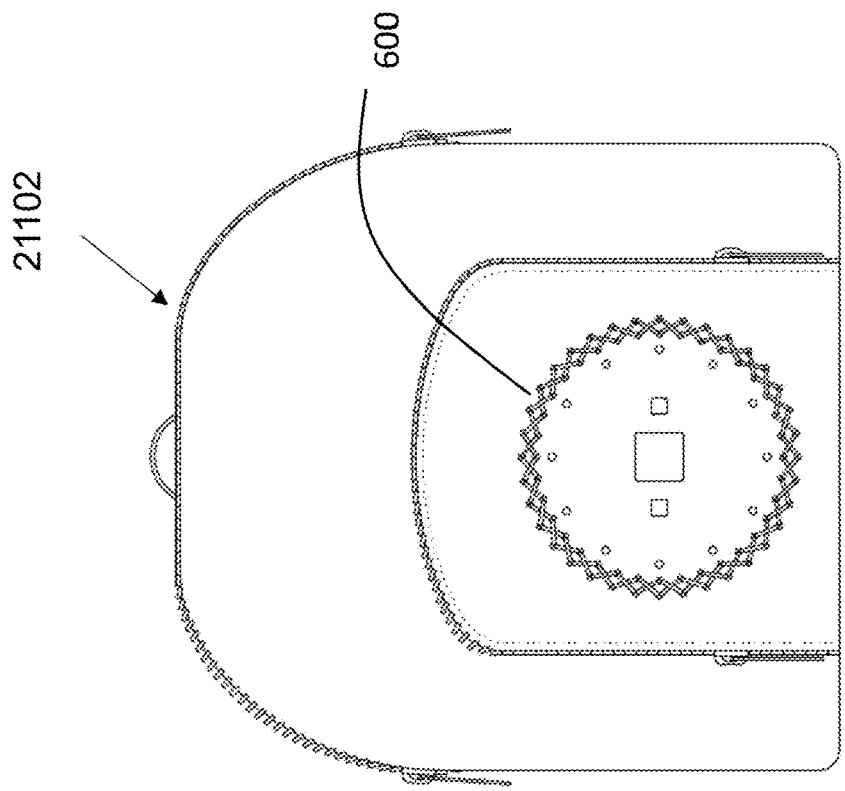
FIG. 20: illustrates a front view of the embodiment (21102) of the present invention, wherein the stitching lines are used to secure two layers of front panel and the bag is a backpack, in accordance with the aspects of the present invention.

In a second embodiment of the first aspect of variations of the present invention, the intelligent portable carrying apparatus is a backpack. Referring to FIG. 20, the backpack 21102, have a front panel, a left and right edge and a bottom edge.

In a third embodiment of the second aspect of variations, the two-component intelligent portable carrying apparatus does not have a clearly defined front panel with identifiable edges, but at least one portion of a surface of the two-component intelligent portable carrying apparatus is flat in one of in-use configurations.

In one example of the third embodiment, the bag is a tote bag, wherein the side walls the of bag are connected all together with no interruptions. However, when the PCB item is placed inside a front compartment of the side, the surface thereon will become flat and conformal to the PCB element, so that the LEDs on the PCB can still emerge from the orifices of the side surface of the tote bag.

In accordance with the teachings of the present invention, disclosed herein, the two-component intelligent portable carrying apparatus, in a third aspect of variations of the modular system, a flat compartment is provided to the carrying apparatus. The flat compartment has an exterior surface and interior surface, configured to receive a detachable Printed Circuit Board (PCB) assembly between the exterior and interior surfaces. Further, the exterior surface has a first edge, a second edge, a third edge and fourth edge, and the four edges are connected together circumferentially define an exterior surface of the flat compartment. Additionally, the exterior surface of the flat compartment is permanently fixed to one of the exterior walls of the portable carrying apparatus by the fourth edge of the exterior surface. The second edge of the flat compartment is releasably attached to the one of the exterior walls of the portable carrying apparatus of the portable carrying apparatus by means of a second connecting member, and the third edge of the flat compartment is releasably attached to one of the exterior walls of the portable carrying apparatus by means of a third connecting member, the second connecting member and the third connecting member are configured to allow the exterior surface of the flat compartment to form an adjustable angle with one of the exterior walls of the portable carrying apparatus, intermittently or continuously at least between 0-180 degrees.

In one variation, the flat compartment is in a front panel of the bag. In another variation, the flat compartment is in a front or top panel of a bag. In still another variation, the flat compartment is on the side panel of a bag or backpack. In yet another variation, the flat compartment is in a flap panel of a bag or backpack, the flap panel can be a panel configured to be laid on top of a body of the bag and/or covers a top or body of the bag.

In one example, referring to FIG. 1, flat compartment 401 is illustrated. The flat compartment has an exterior surface 402, which is flat after the PCB element is placed properly between the exterior and interior surface of the flat compartment. In the embodiment handbag 11101 and embodiment backpack 21102, the exterior surface of the flat compartment is conformal to the surface of the front panel of the handbag and backpack, but these two embodiments should not be considered as limiting. The exterior surface of the flat compartment may slightly protrude from the surface of the front panel of the handbag or backpack, to make the LED display from the PCB element more visible.

The flat compartment 401, in this example, has a first edge 403, which is a top edge of the exterior surface of the flat compartment, a second edge 404, which is a left edge of the exterior surface of the flat compartment, a third edge 405, which is a right edge of the exterior surface of the flat compartment, and a fourth edge, which is a bottom edge of the exterior surface of the flat compartment. The four edges are connected together circumferentially define an exterior surface of the flat compartment. In this example, flat compartment is rectangular shaped.

In another example, the flat compartment having four edges which are curved or circular, the four curved edges connected together to jointly define a round and oval shaped periphery.

In the scope of the present invention, described herein, the flat compartment can be of any shape.

There has been long felt need to place a light emitting element in a wearable item with at least some degree of control of the light emitting element for illumination, entertainment or social recreation purposes. A key impediment to the creation and widespread adoption of such a system is the difficulty in removably attaching a control unit to the wearable item. One key aspect of the present invention, is to solve this technical challenge. In the present invention, the flat compartment can be widely opened or narrowly opened to form different configurations to assist the placement or removal of the components in PCB assembly. FIGS. 8-13 show that the flat compartment can be opened to form 90-degree angles with respect to the front panel of the bag.

In the meantime, the top edge 403 of flat compartment remains open, which offer further access to interior surface of the flat compartment.

In the embodiment handbag 11101 and embodiment backpack 21102, the flat compartment is permanently attached to the front panel of the handbag and backpack through the bottom edge 406. The flat compartment is releasably attached to the front panel through a first connecting member 304 and second connecting member 305. The first connecting member 304 and second connecting member 305 are disposed next to the left side edge and right side edge of the flat compartment respectively. In one example, the first connecting member 304 and second connecting member 305 are zippers, which allows the flat compartment to be opened and closed easily.

Further the first and second connecting members may be connected to be form one elongated zipper along the periphery of the flat compartment. In some variations, the flat compartment has a same dimension as the front panel.

Figure 13:
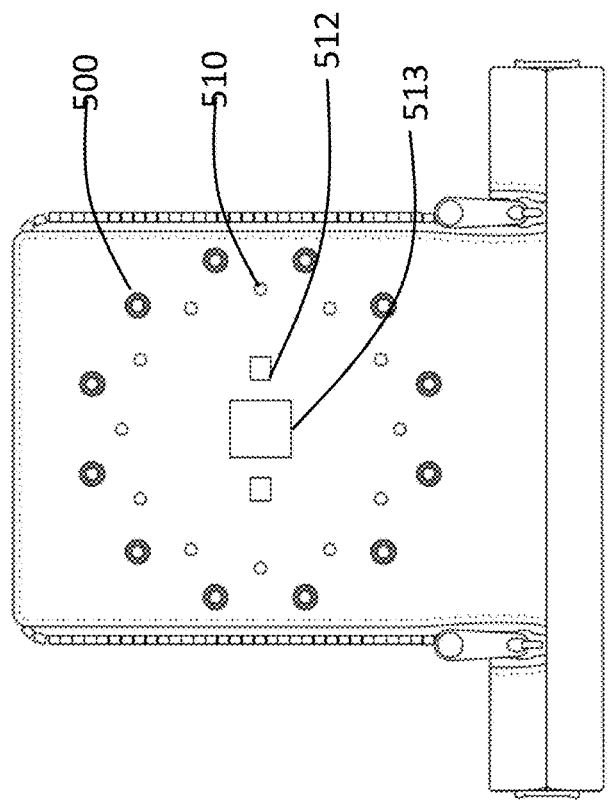
FIG. 13: illustrates a bottom view of the embodiment (11101) of FIG. 8, in accordance with the aspects of the present invention.

Additionally, in some variations, the exterior surface of the flat compartment is provided with a plurality of orifices. The plurality of orifices is adapted to receive or expose surface features of the PCB assembly, and said surface features are selected from a plurality of LEDs disposed on a first surface of a PCB board. Referring to FIG. 13, exterior surface of the bag is provided with a plurality of orifices in a first display arrangement (512) as LED windows, each orifice is substantially around and measured as having diameter substantially similar to the diameter of each LED, which is configured to allow all the emission from the LEDs can emerge or escape from exterior surface of the handbag. Referring to FIG. 13, the orifices in a first display arrangement is an arrangement is shown, it includes individual orifices in a circular arrangement.

Optionally, in another example, a plurality of orifices in a second display arrangement 512 as LED windows are provided, which is configured to allow the LEDs in the second display arrangement to emerge or expose. The second display arrangement has a different layout than the first display arrangement. For example, the LEDs in the first display arrangement is arranged in a circular manner along a periphery of the PCB board and the second display arrangement includes LEDs linearly arrangement in rows and/or columns at a different place, for example, at a center of the PCB board.

Optionally, still in another example, a plurality of orifice(s) in a third display arrangement, 513, an LED windows or windows are provided, which are configured to allow the LEDs in the third arrangement to emerge or be exposed, wherein the LEDs in the third arrangement having one dimension greater than a dimension of a LED in the first arrangement.

The first, second and third arrangements of LEDs, can be physically arranged to form any shape. Alternatively, the first, second and third arrangement of LEDs can be accomplished with one general hardware layout but configurated to be light up to be visualized as different shapes and patterns at any given time, according to instructions from the software which is intended to be user-configurable.

There are an infinite number of shapes that are possible. The most common and easy to make ones are a circle, a line and a regular grid. In the scope of the present invention, it also includes the LEDs arrangement to illuminate the shape of a Disney character or other customary images.

In one embodiment of the third aspect of variations of the modular system, the interior surface of the flat compartment, is attached to the exterior surface of the flat compartment. The interior surface of the flat compartment moves with the exterior surface of the flat compartment.

Figure 12:
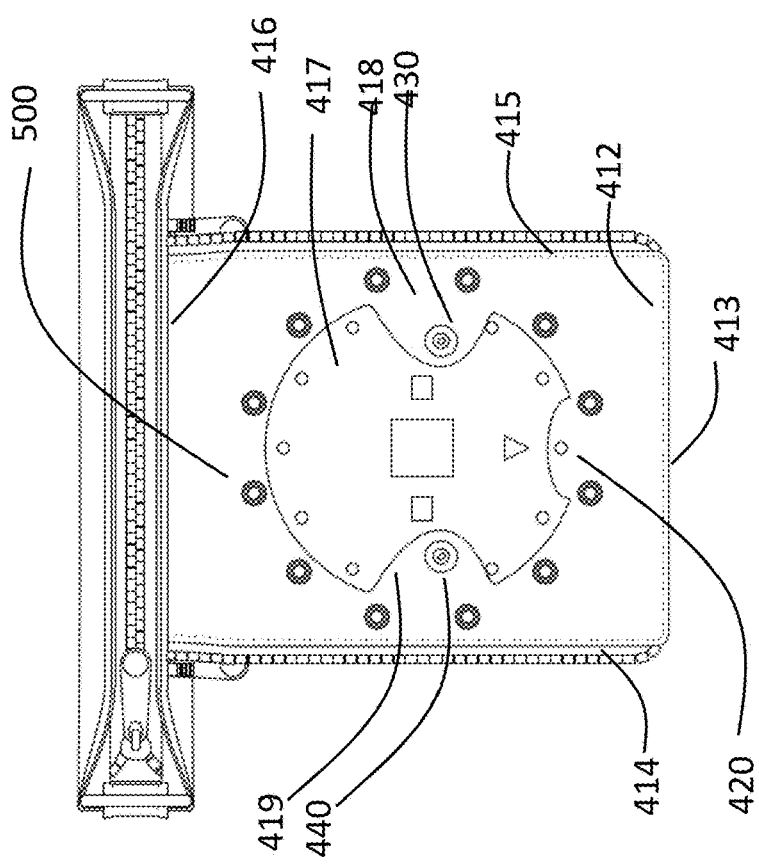
FIG. 12: illustrates a top view of the embodiment (11101) of FIG. 8, in accordance with the aspects of the present invention.
Figure 15:
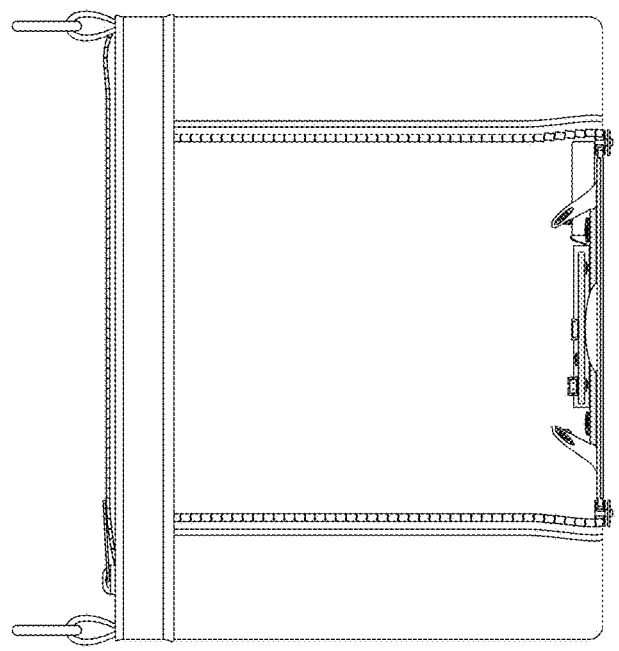
FIG. 15: illustrates a front view of the embodiment (11111) of FIG. 13 of the present invention, in accordance with the aspects of the present invention.

Referring to FIG. 12, a top view of flat compartment of the modular system is illustrate. The interior surface of the compartment 412 comprises a first edge 413, or a top edge of the interior surface of the flat compartment; a second edge 414, or a left edge of the interior surface of the flat compartment; a third edge; 415 or a right edge of the interior surface of the flat compartment; a fourth edge 416, or a bottom edge of the interior surface of the flat compartment. Referring to FIGS. 12-13, the left and right edges of the interior edges are joined with left and right edges of the exterior edges with part of a first connecting member 304 and second connection member 305. The top edge of the interior surface and the top edge of the exterior edge meets to form one boundary of the flat compartment. The first and second connecting members are zippers. The zippers allow the flat compartment to be in closed, semi-closed or halfway-closed, and open configurations.

Referring to FIGS. 8-11, when the exterior surface and interior surface of the flat compartment are attached together. When the zippers open, the interior surface moves with the exterior surface.

In another embodiment of the third aspect of variations of the modular system, the interior surface of the flat compartment, is sandwiched in between exterior wall and its corresponding interior wall of the portable carrying apparatus, but it is separated from the exterior surface of the flat compartment. The interior surface of the flat compartment does not move with the exterior surface of the flat compartment when it opens or closes with respect to the semi-enclosed area formed by the interior walls, or equivalents thereof. Instead, in one example, the interior surface of the flat compartment is disposed on a surface of interior wall of the portable carrying apparatus.

Figure 8:
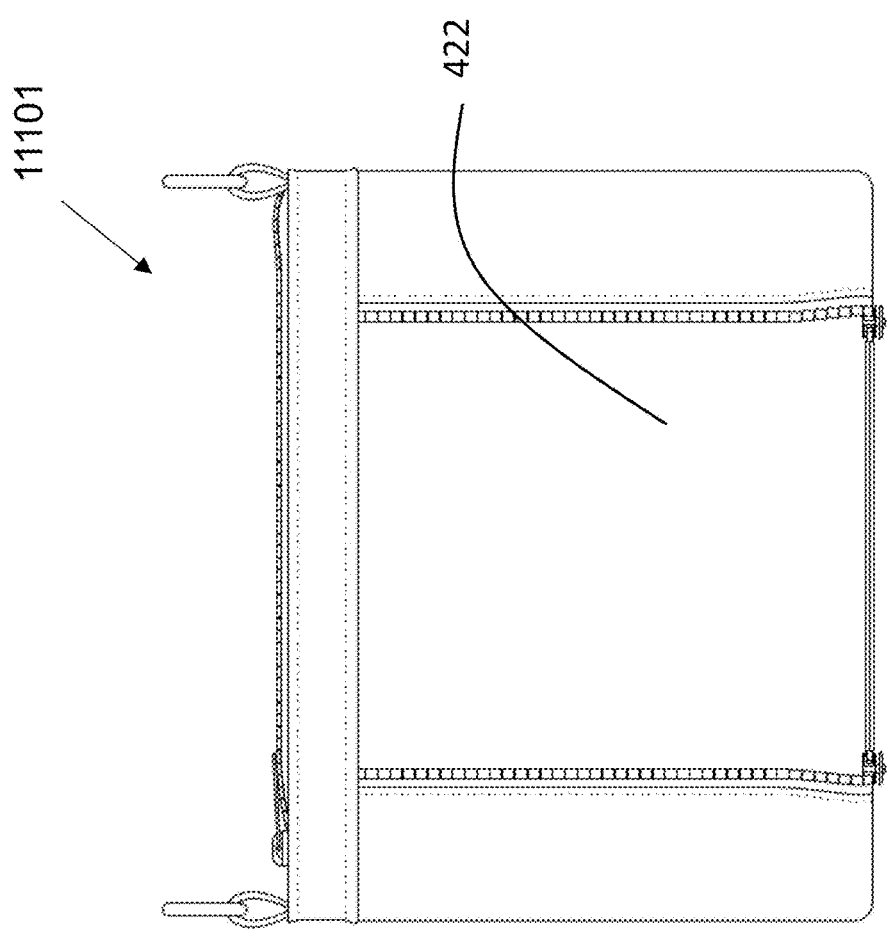
FIG. 8: illustrates a front view of the embodiment (11101) of the present invention, and the front panel is in an open configuration, in accordance with the aspects of the present invention.
Figure 11:
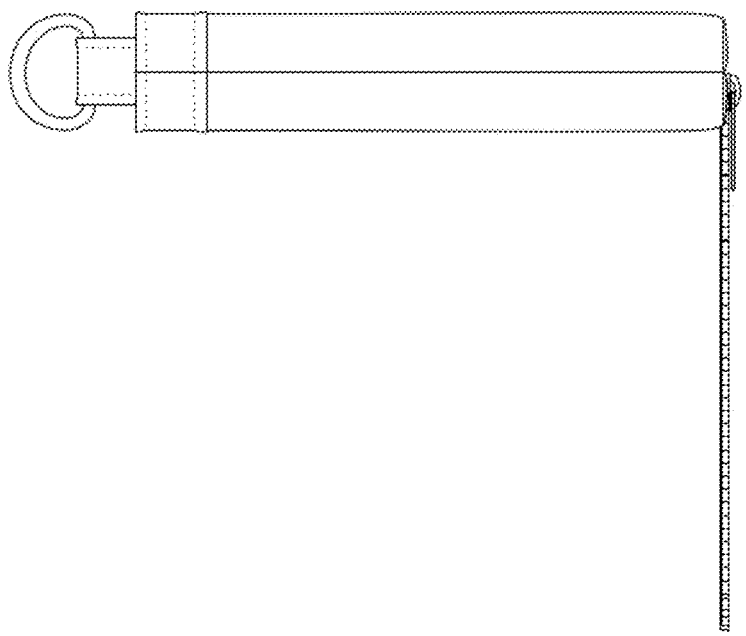
FIG. 11: illustrates a right sideview of the embodiment (11101) of FIG. 8, in accordance with the aspects of the present invention.
Figure 10:
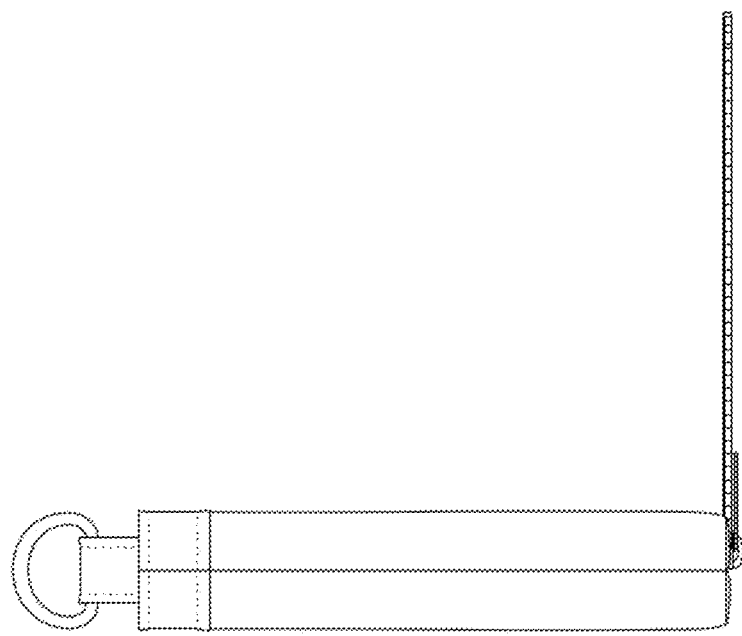
FIG. 10: illustrates a left sideview of the embodiment (11101) of FIG. 8, in accordance with the aspects of the present invention.

Referring to FIG. 8, the interior surface of the flat compartment is disposed on the surface of the 422, a lining of the bag.

Referring to FIG. 12, the interior surface of the flat compartment comprises a cavity of the interior surface 417, a first flap member 418, a second flap member 419. Optionally, the interior surface of the flat compartment comprises a third flap member 420. The interior member of the flat compartment is configured to accommodate the PCB element. In one example, the PCB element has a diameter around 9-9.5 cm and a pseudo diameter of the cavity is about 9-10 cm. A pseudo diameter of the cavity means either a longest diameter or an average diameter of the cavity.

In accordance with the teachings of the present invention, disclosed herein, the two-component intelligent portable carrying apparatus, in a fourth aspect of variations of the modular system, comprises a PCB assembly. The interior surface of the flat compartment has a shallow cavity to accommodate the printed circuit board (PCB) element in the PCB assembly. The PCB element is secured in the flat compartment, preferably by means of attachment members. For example, a first attachment member and a second attachment member (430 and 440) as illustrated in FIG. 12. The first attachment member and second attachment member each has its respective complimentary joining members on a second surface of the PCB element and the interior surface of the flat compartment.

Components of PCB Assembly

Figure 28:
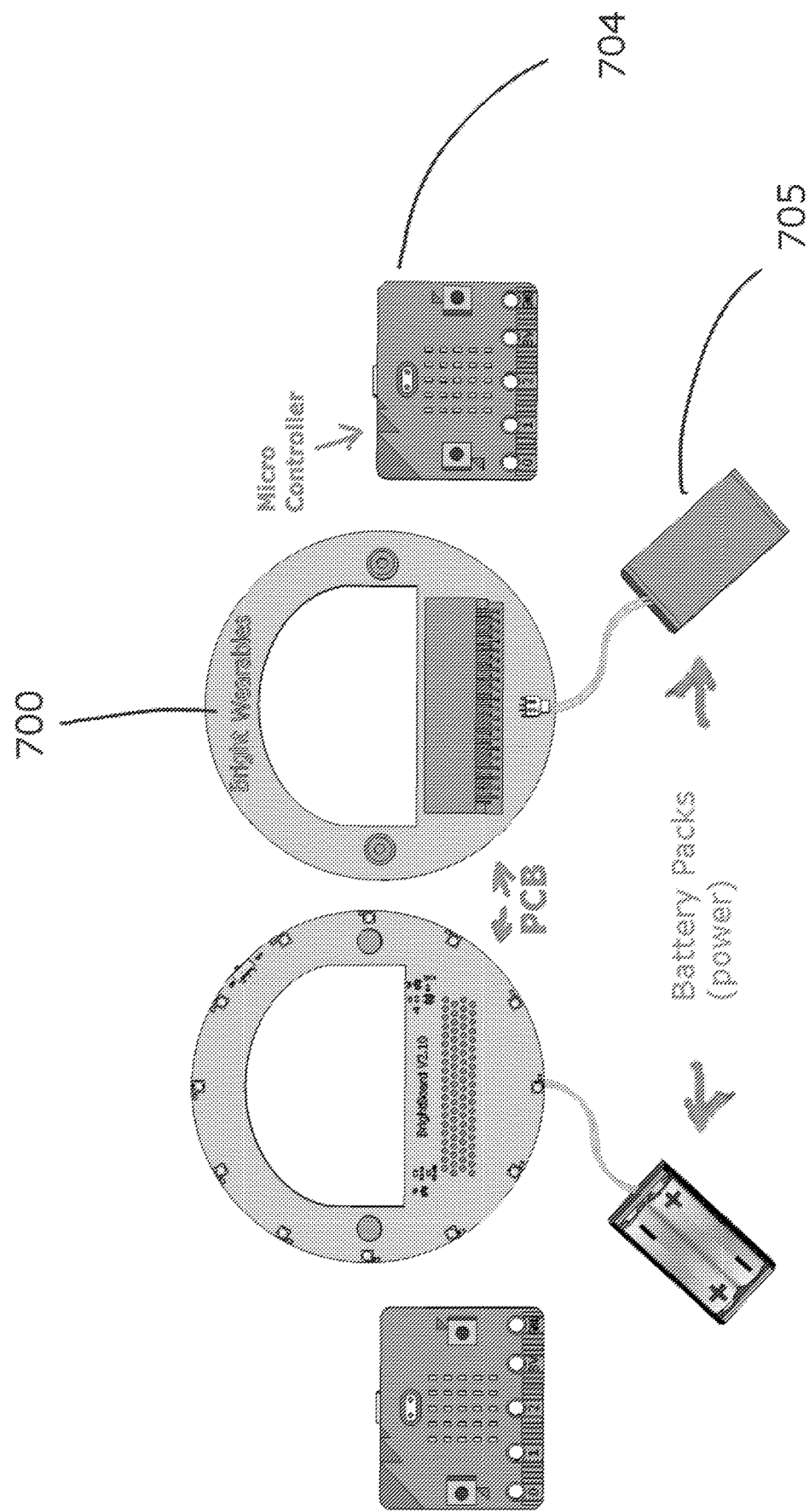
FIG. 28: illustrates a PCB board, a microcontroller and a battery unit, and the PCB board have electrical and signal connections inside the PCB, in accordance with aspects of the present invention.

The PCB assembly is an assembly of electronics/power/illumination components of the modular system of the present invention. Referring FIG. 28, the PCB assembly 699 is comprised of a Printed Circuit Board (PCB) element 700, a programmable control element 704 and a power source 705. The Printed Circuit Board (PCB) element 700 has LEDs disposed on a first surface and further includes electronic components.

Figure 30:
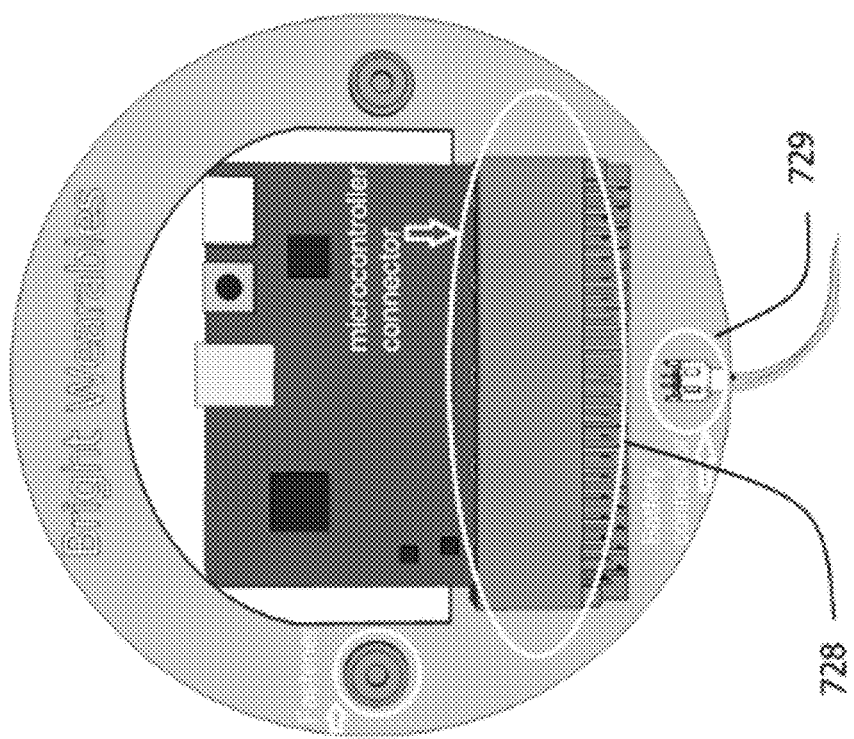
FIG. 30: illustrates a back view of a PCB board and a microcontroller PCB assembly.
Figure 29:
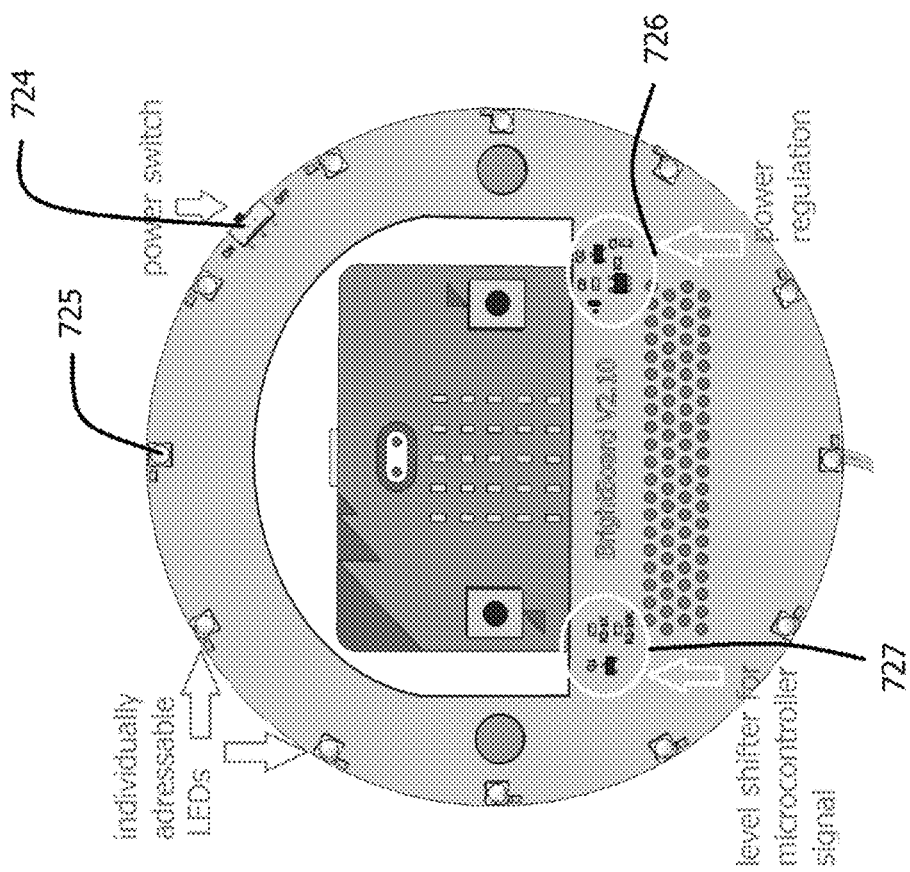
FIG. 29: illustrates a front view of a PCB board and a microcontroller PCB assembly.

FIGS. 29 and 30 show detail structure of an exemplar PCB element, including a power switch 724, a plurality of individually addressable LEDs 725, a power regulation 726, a level shifter circuit 727 for microcontroller signal, on a first side of the PCB element. On the second side of the PCB element, a first electrical connector 728 on the PCB element for the microcontroller, and a second electrical connector 729 on the PCB element for adapted for the battery assembly are provided.

Figure 23:
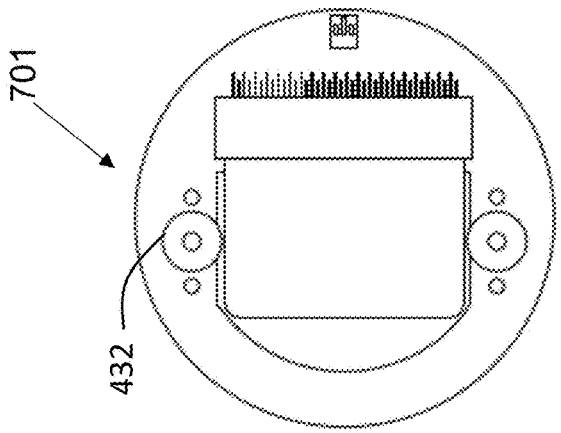
Figure 25:
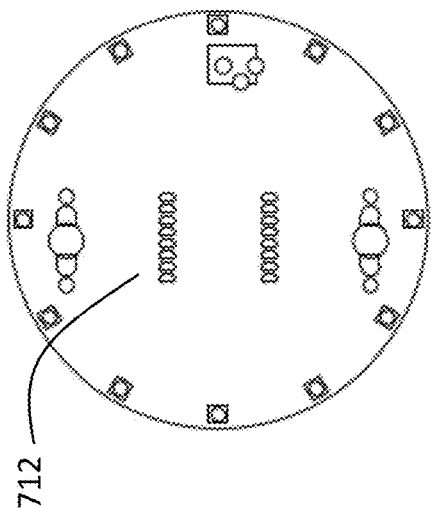
Figure 27:
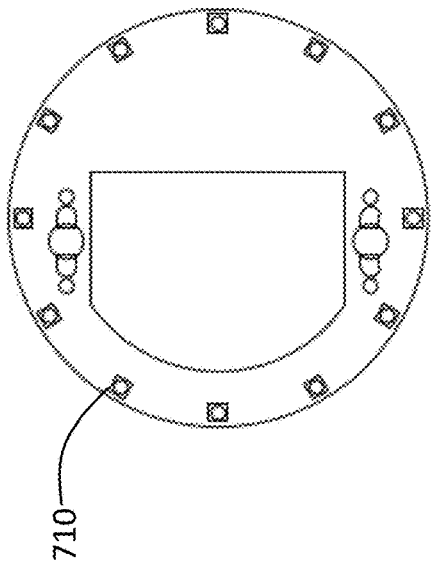

Further, the plurality of individually addressable LEDs 725 are arranged in a configuration, as a LED array in a first arrangement 710, shown in both FIG. 23 and FIG. 29, which matches the first plurality of orifices as LED windows in the first display arrangement 510.

Further, the individually addressable LEDs are either RGB full color illumination elements, or one-color LEDs or color changeable LEDs. The signal level shifter for communication between LEDs is configured to operate at 5V and microcontroller is configured to operate at 3.3V. Power regulator to adapt battery voltage (up to 5V) to microcontroller input voltage (3.3V). The first connector is to transmit the microcontroller signal to the PCB as well as provide regulated power to the microcontroller. The second connector, a battery connector provides power input to the PCB assembly.

Figure 22:
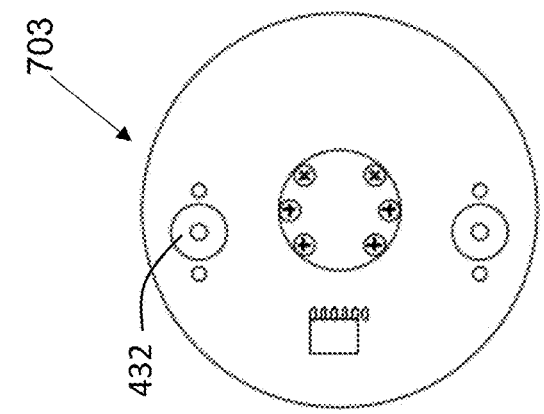
FIGS. 22 and 23 are back and front views of one example of the PCB, in accordance with aspects of the present invention.
Figure 24:
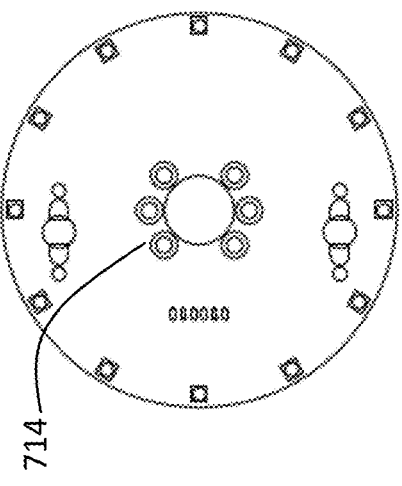
FIGS. 24 and 25 are back and front views of another example of the PCB, in accordance with aspects of the present invention.
Figure 26:
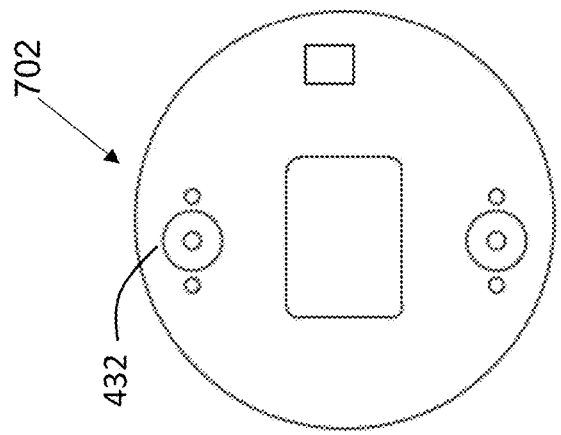
FIGS. 26 and 27 are back and front views of still another example of the PCB, in accordance with aspects of the present invention.

The PCB element, on the second surface, opposite to the surface where the plurality of LEDs are disposed, is provided with one or a pair of 432, joint elements configured to join or attach the PCB element to the interior surface of the flat compartment. As illustrated in FIGS. 22, 24 and 26, the joint elements 432 are disposed symmetrically around the second surface of the PCB element to balance the weight and provide minimal deformation to the flat appearance, which is substantially flat, for the flat compartment.

Figure 18:
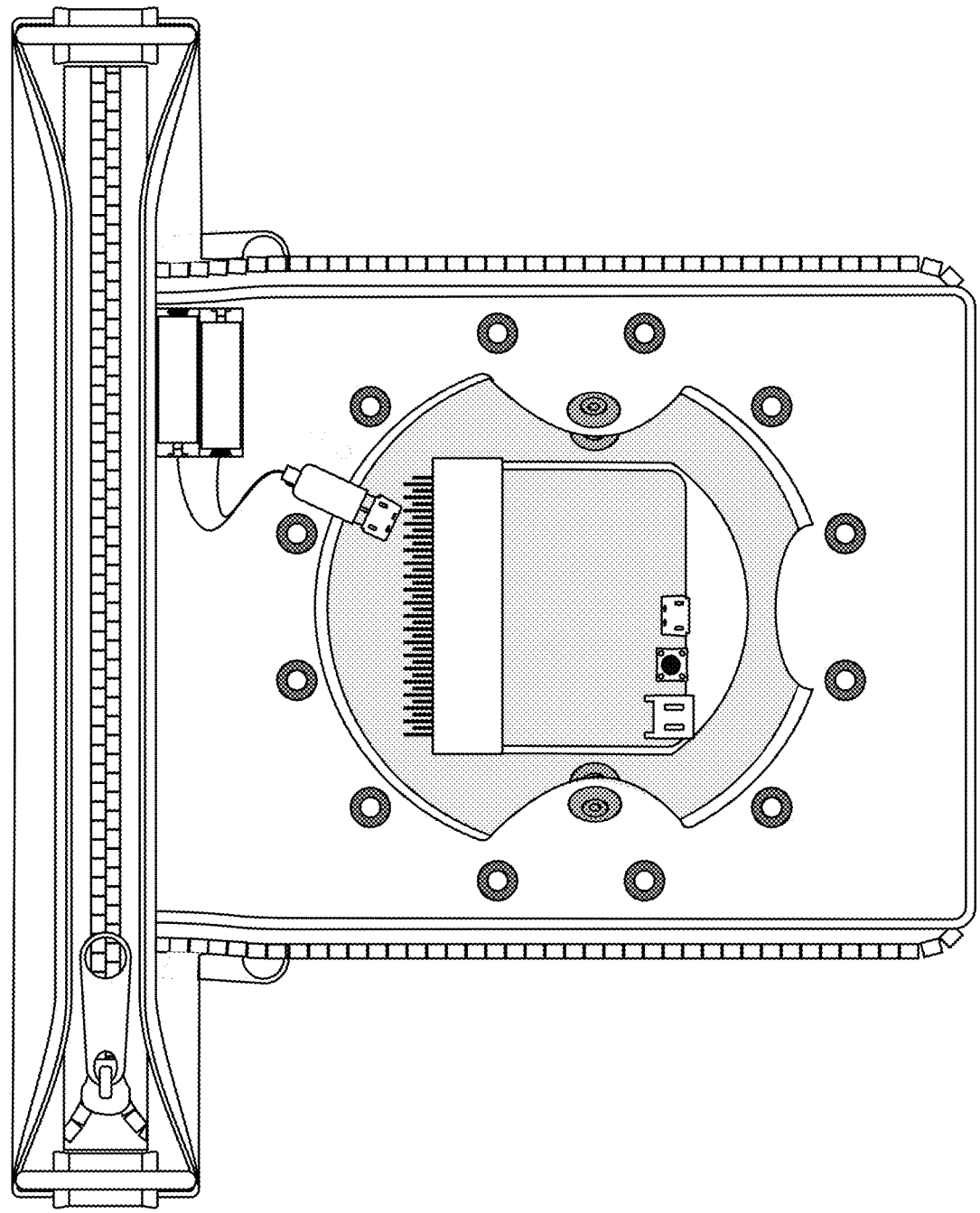
FIG. 18: illustrates a right view of the embodiment (11111) of FIG. 13 of the present invention, in accordance with the aspects of the present invention.
Figure 19:
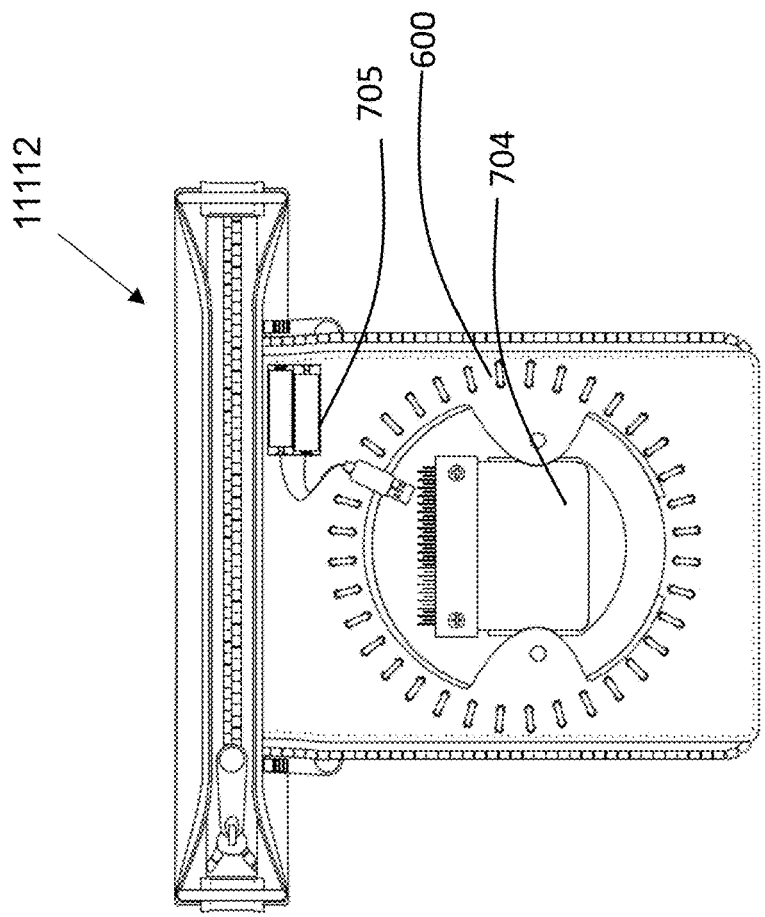
FIG. 19: illustrates a top view of the embodiment (11112) of the present invention, wherein the stitching lines are used to secure two layers of front panel, in accordance with the aspects of the present invention.

FIGS. 1-11 are directed to a modular system with the flat compartment empty. FIGS. 12-19 are directed to a modular system with a PCB assembly attached to the flat compartment. Referring to FIGS. 19 and 20, when the PCB assembly installed in the flat compartment, the power supply is disposed near the bottom edge of the flat compartment or the bag.

Functions of PCB

Important features of the PCB element are that it (1) connects, regulates and transforms power input from the battery, and distributes it to the LEDs and microcontroller and (2) it provides the connection for data signals to travel from the microcontroller to the addressable LEDs. The non-electrical components of the PCB elements, joint elements 431 on the PCB element, allow the PCB element to be precisely aligned with the exterior surface of the flat compartment, so that the individual LEDs align with orifices (510, 512, 513) of the exterior surface of the flat compartment and are visible from the outside the carrying device. Additionally, the first and second connectors on the PCB holds the microcontroller in a fixed place relative to the PCB element. This is particularly useful if the microcontroller has a display of its own that may be visible through the front of the carrying device and must stay aligned with orifices (512, 513) of the exterior surface of the flat compartment.

In one embodiment of the fourth aspect of variations of the modular system, the programmable control element or micro-controller is detachable from the PCB element. The PCB element has a connector adapted to the micro-controller. In one example, the connector only adapts to one kind of a micro-controller. In one instance, a connector of the PCB element must have the correct form and shape to accommodate the desired microcontroller. If a user wishes to use a different microcontroller in an existing carrying device, then a different PCB element, containing the appropriate connector must be obtained. Whereas, in another example, the connector may be adapted to more than one kind of micro-controller.

In another embodiment of the fourth aspect of variations of the modular system, a programmable control element or micro-controller is integrated onto the PCB element. And the PCB element and the microcontroller work together as a one-to-one correspondence pair.

The microcontroller may further comprise a second LED array in a second arrangement. The second LED array 712 may include rows and columns of LEDs. The microcontroller may further comprise a third LED array, or another illuminating element in a third arrangement. The third illuminating elements may be disposed symmetrically around a center of the circular LED arrangement to enhance the display effect.

The first, second, and third arrangement of LEDs in the scope of the present application, are primarily for safety and recreational purposes. Therefore the brightness of the LEDs are low. In the example of this application, LEDs which draw 1 mA-60 mA are used.

maximum of 60 mA per LED, but in practical usage it is much less—closer to 10 mA per LED.

Additionally, and optionally, in some embodiment of the fourth aspect of variations, the PCB assembly further comprises environmental sensors.

In one example, a programmable control element receives instructions via user-supplied computer code.

In another example, the programmable control element receives instructions via connection to a computer or smart phone through a cable, wi-fi or Bluetooth connection.

In still another example, the programmable control element is configured to supply signals to the PCB to control the individually addressable LEDs.

In yet another example, the programmable control element is configured to receive power from the PCB assembly.

The microcontroller may be programmed to change the pattern, color, illumination level and illumination time of the LEDs on the PCB element in response to input, including instructions or input from various sensors.

Additional Sensors

Additional sensors can be provided to either microcontroller or on the PCB element. The microcontroller may contain sensors to detect events in the surrounding environment. Examples of these sensors include, but are not limited to, a microphone to be responsive to sound, an accelerometer and or gyroscope to be responsive to motion and orientation, buttons to respond to user inputs via button press, a capacitive touch sensor to respond to being touched, a light sensor to detect brightness, a color sensor to detect the color of items in the environment, a temperature sensor.

PCB and Microcontroller Relationship

Figure 33:
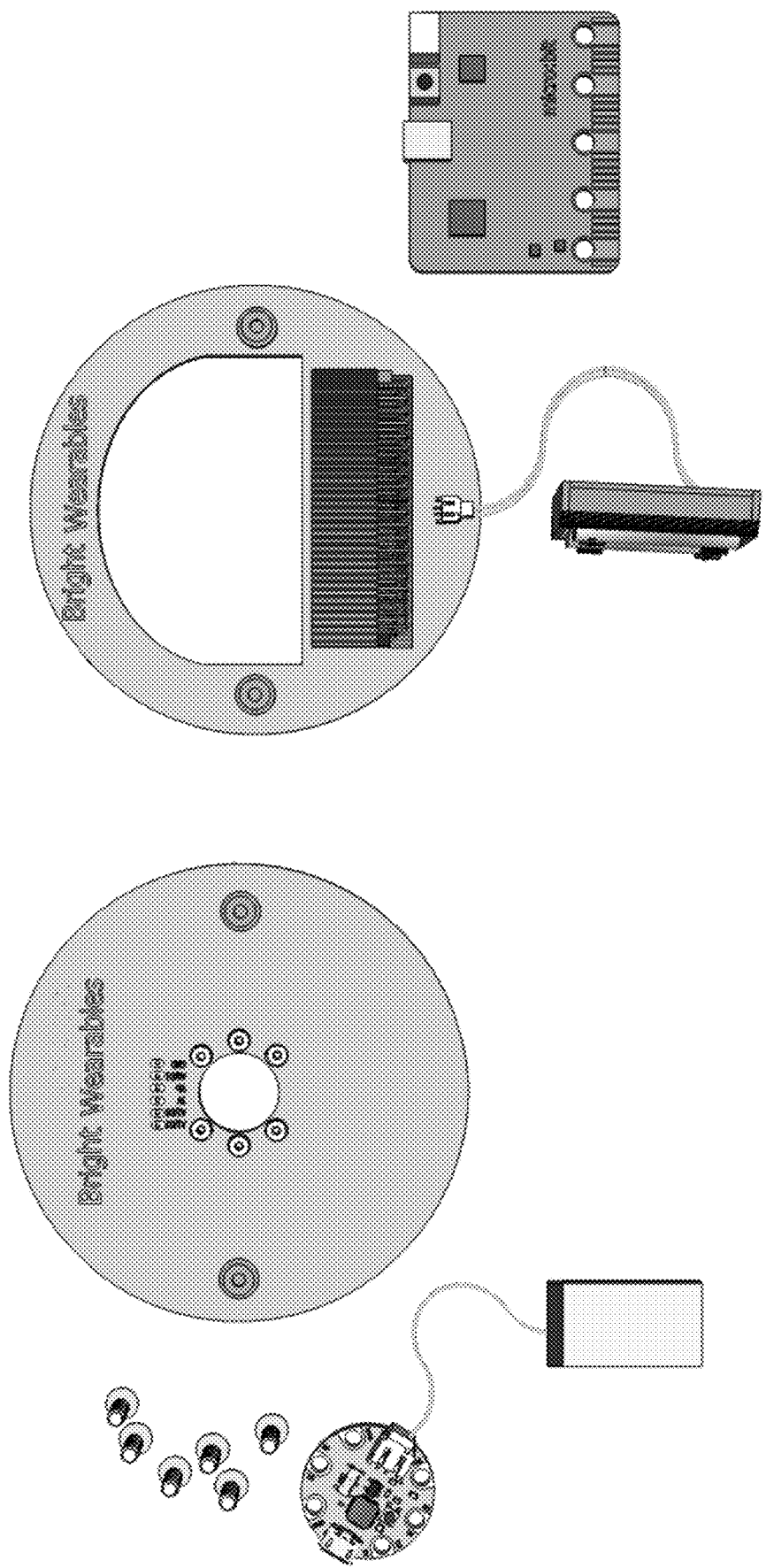
FIG. 33: illustrates PCBs designed for two different microcontrollers: Adafruit Gemma M0 at left; and BBC micro:bit at right.

The microcontroller must contain a method of supplying signals to the PCB to control the LEDs and are able to receive power from the PCB at the same time. The connector on the PCB must have the correct form and shape to accommodate the microcontroller. FIGS. 22-27 shows different PCBs with and without microcontrollers. FIGS. 29 and 30 show an example of two different PCBs whose design differs to accept two different microcontrollers. FIG. 33 shows two different microcontrollers that may connect to the PCB. In this example, the microcontroller at left is an Adafruit Gemma M0 and the micro controller at the right is a BBC micro:bit. In FIG. 33, on the left, the power source is connected directly to the Gemma M0 microcontroller itself and not to the PCB. In FIG. 33, on the right, the power source is connected PCB element.

Figure 34:
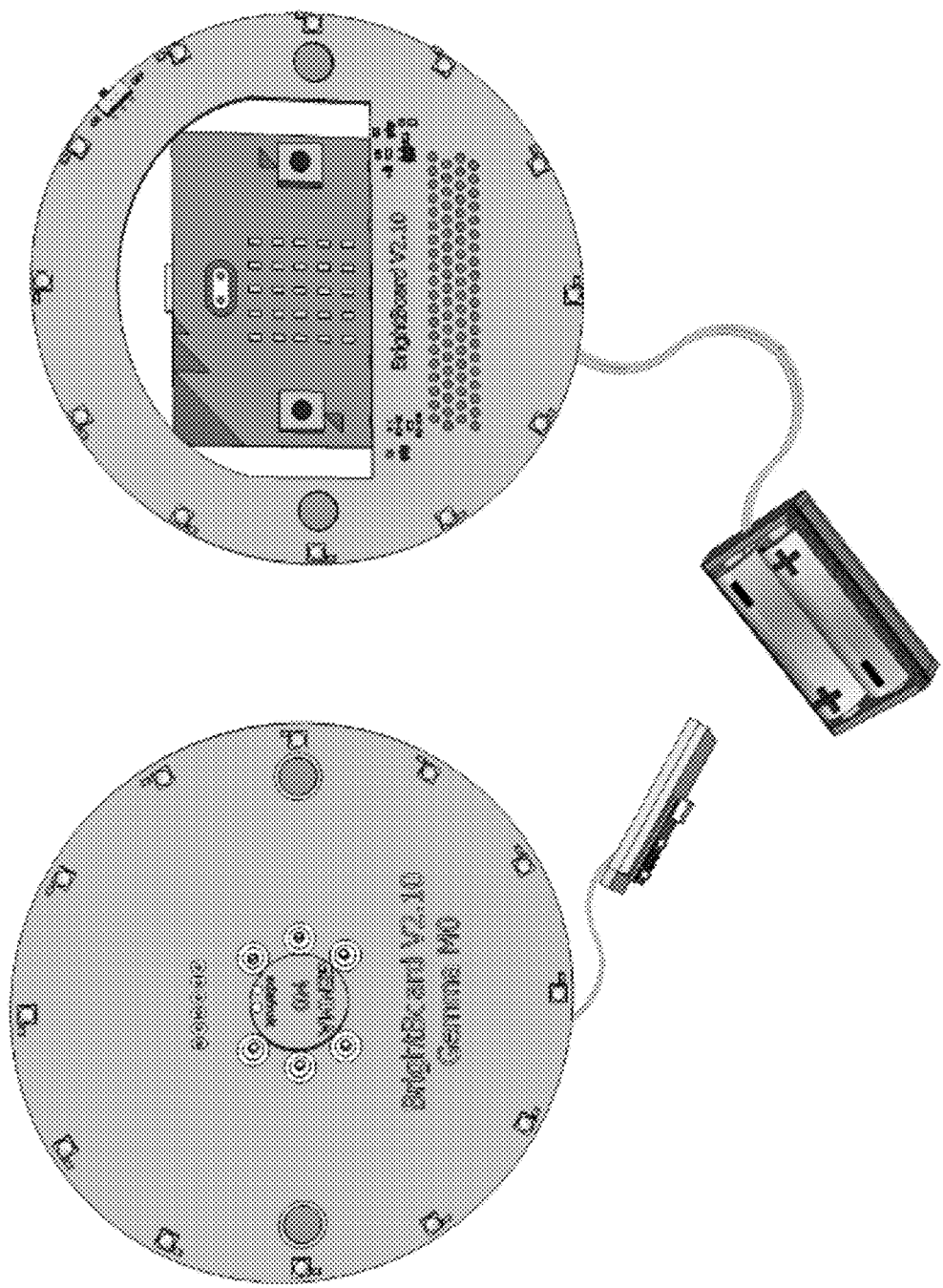
FIG. 34: illustrates a front view of PCBs attached to two different microcontrollers.
Figure 35:
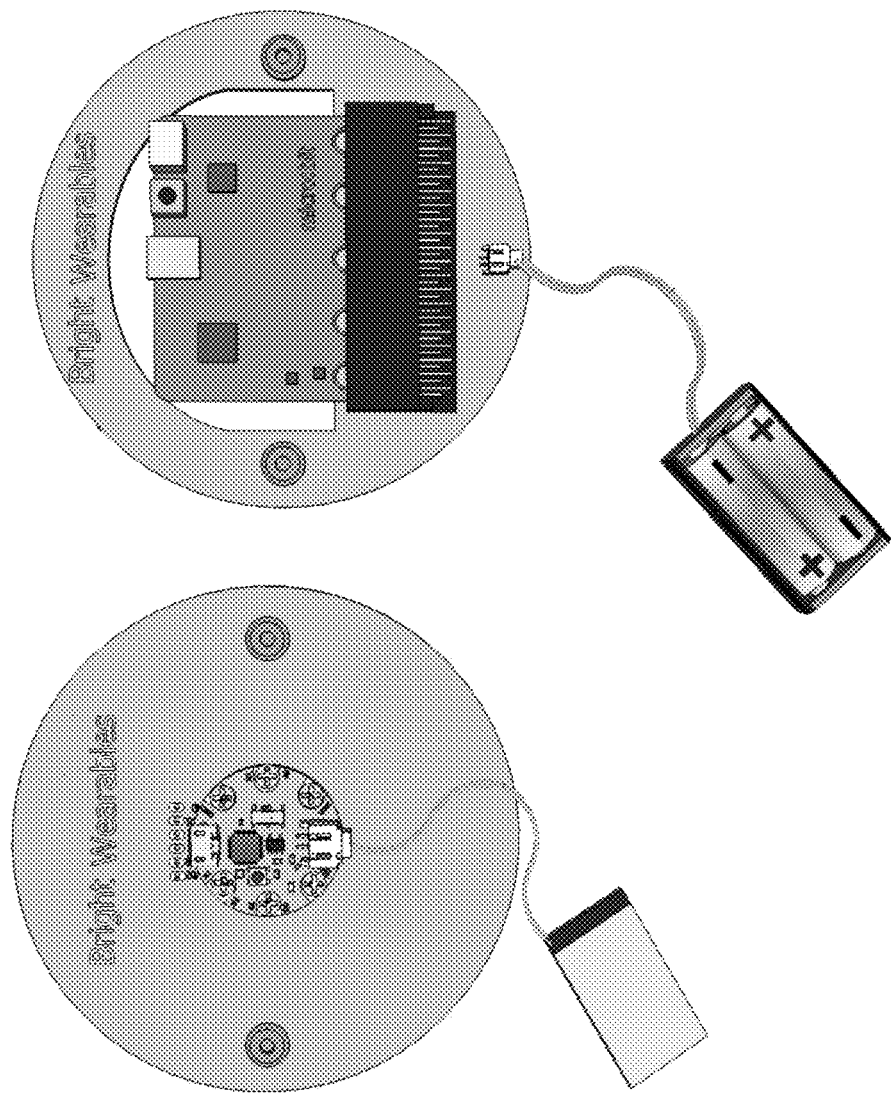
FIG. 35: illustrates a back of PCBs attached to two different microcontrollers.

PCB having different microcontrollers may contain different illumination patterns. The microcontroller shown at right in FIG. 34, the BBC micro:bit contains a matrix of LEDs (a second arrangement of LEDs and two push buttons that are accessible through a window or windows in the exterior surface of the micro-controller. Therefore, the PCB has a hole in the center to allow the micro:bit LEDs and buttons to be accessed through the PCB. Further, different PCB element have different connectors to attach the microcontroller. Referring to FIG. 35, the PCB on the right contains a slide-in contact connector to attach to a BBC micro:bit microcontroller. The PCB on the left contains screw-connectors to attach to an Adafruit Gemma M0 microcontroller through its screw terminal pins.

The Power Source (Battery Pack)

In the scope of the present invention, different kinds of batteries and the different possible means of attachment to the PCB element are disclosed and described.

In general, the illumination sources (addressable RGB LEDs) used in the present invention require 3-5 Volts to function properly. Any battery pack meeting these conditions that can supply enough power to light all the LEDs and power the microcontroller can be used.

In order to provide the PCB assembly with an input voltage between 3 and 5 volts in a portable manner, a battery pack is used. Three examples of batteries which provide portable power in this voltage range are described below. A first example includes a pack of two (3V) or three (4.5V) alkaline AAA or AA batteries. A second example includes rechargeable LiPo batteries (3.7V). A third example includes a portable phone charger (5V). The first example is preferred when the modular system is included in wearables for children because it offers the lowest risk of fire.

Figure 45:
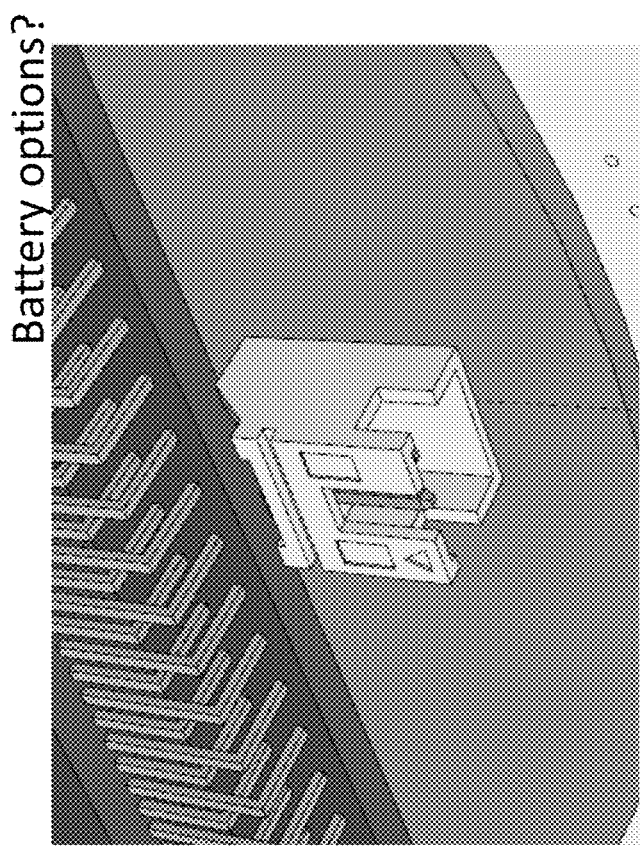
FIG. 45 shows a close-up view of a battery connector which is a JST-PH battery receptacle.
Figure 44:
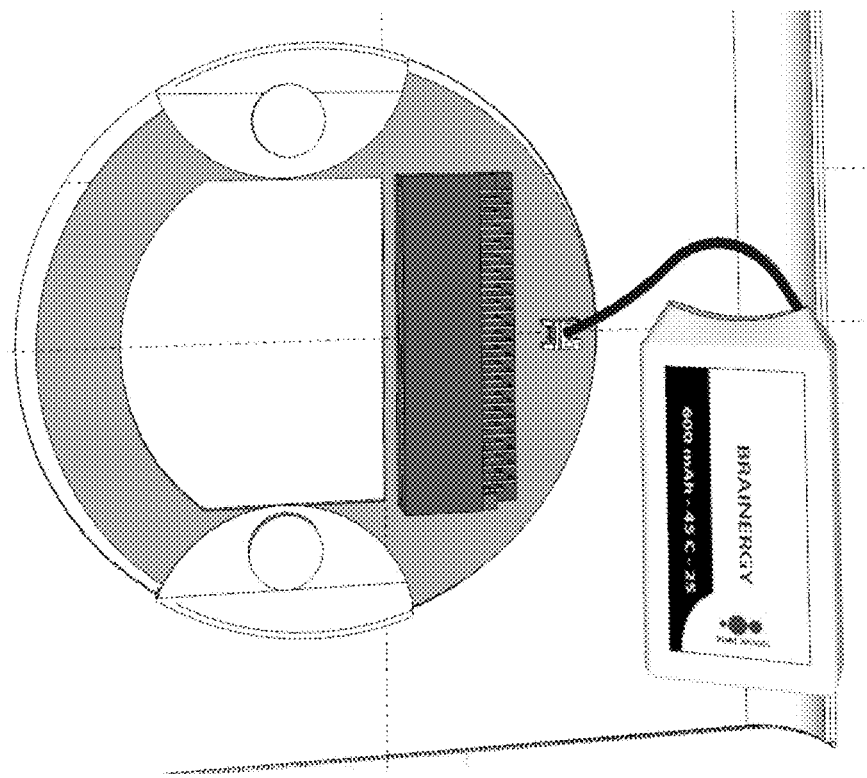
FIG. 44 shows the detachable connector for a battery positioned on the back side of the PCB element.
Figure 46B:
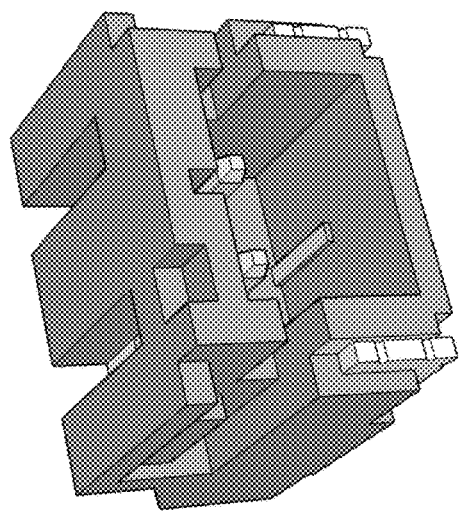
FIGS. 46*a* and 46*b* show a 2-pin JST-PH connector (plug and receptacle shown) for the battery and PCB element connection.
Figure 47B:
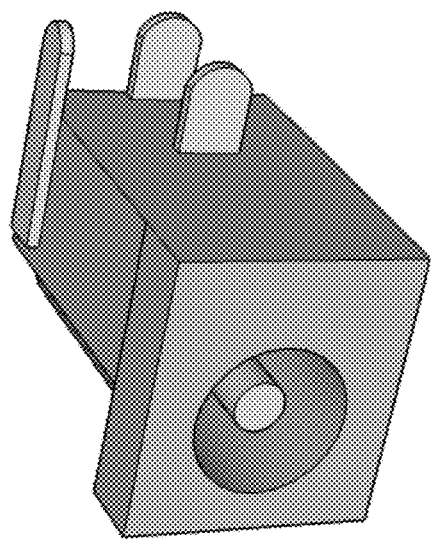
FIGS. 47*a* and 47*b* show a 5.5/2.1 mm barrel jack connector for the battery and PCB element connection.
Figure 46A:
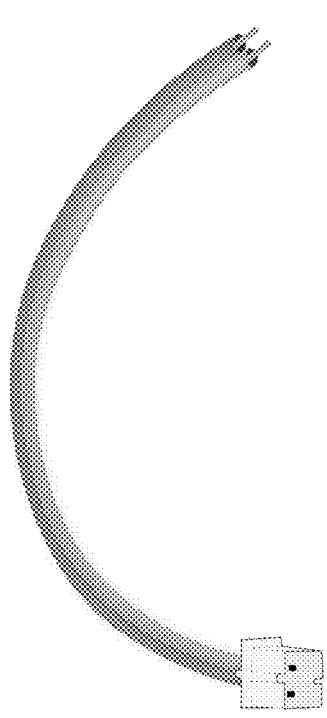
Figure 47A:
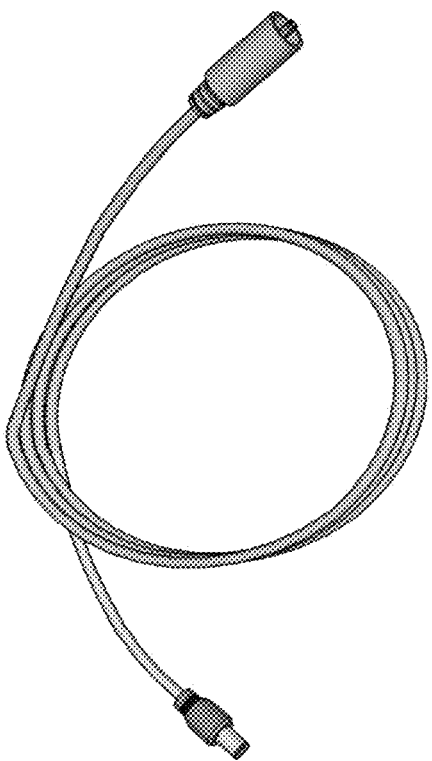
Figure 48A:
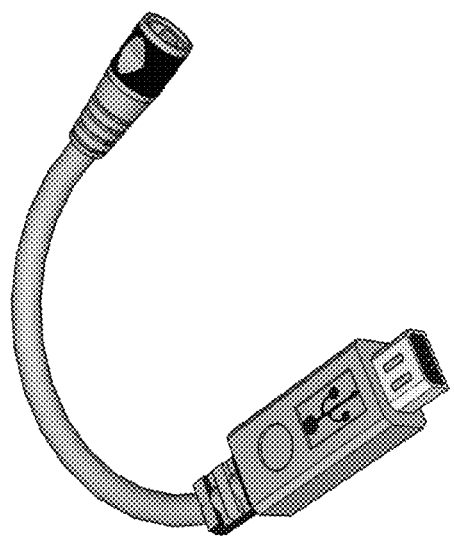
FIGS. 48*a* and 48*b* show a micro-USB connector for the battery and PCB element.
Figure 48B:
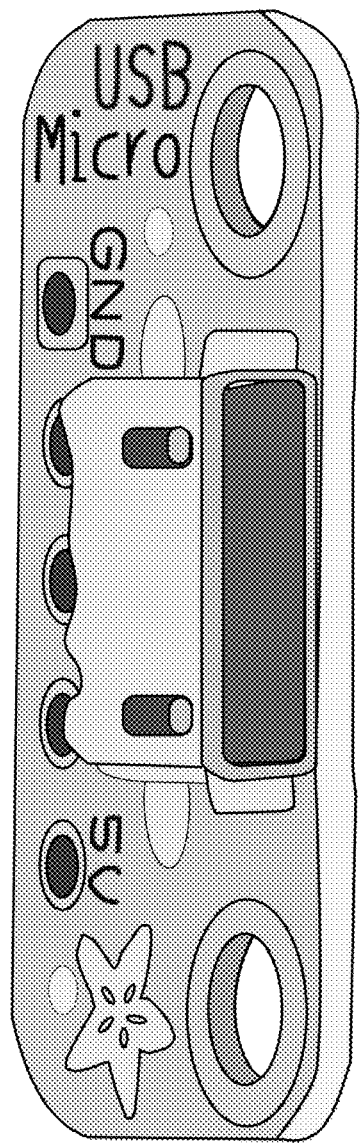

FIG. 44 and FIG. 45 show a close view of a battery or battery assembly connected to the PCB element through a second connector. The second connector is a JST-PH battery receptacle and is mounted parallel to the PCB element.

The power receptacle is soldered to the PCB element— either through-hole or surface mount. In one embodiment, PCB element has the second connector receptacle mounted parallel to the PCB element so the power cable leaves the second connector receptacle parallel to the PCB (see FIG. 2 above). In another embodiment, the second connector receptacle is aligned perpendicular to the PCB and the power cable leaves the PCB at a 90-degree angle.

How Power is Transferred in the PCB Assembly

Figure 38:
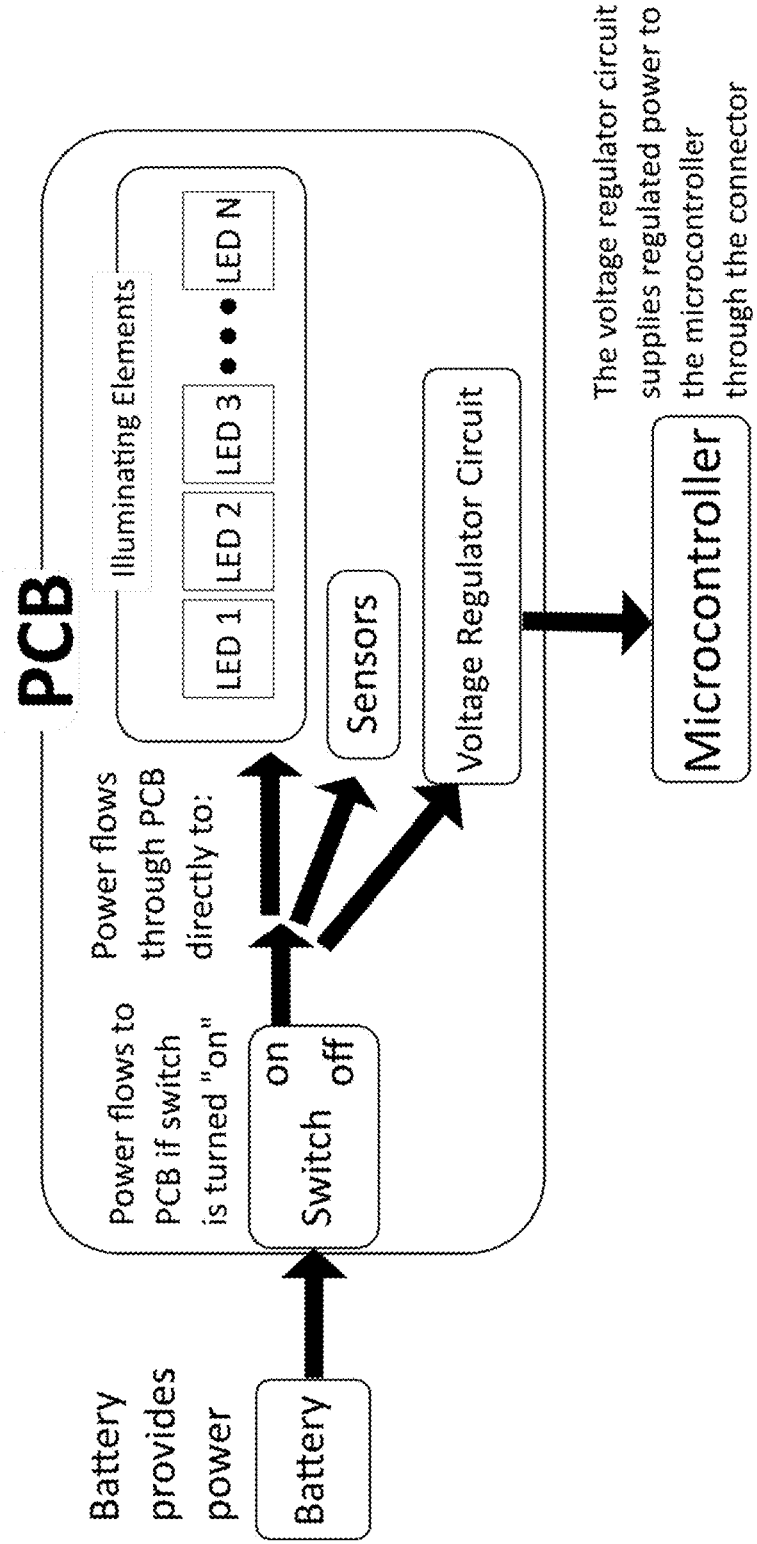
FIG. 38: illustrates one embodiment and how power flows from the battery unit through the PCB and microcontroller.

Referring to FIG. 38, power is supplied to the PCB assembly through the power connector from the power source, for example the battery. The power only flows if the switch on the PCB assembly is turned "on" through the on and off switch. Power enters the PCB and part of it goes directly to the LEDs. Another part of the power directly goes to a voltage regulator circuit. The voltage regulator circuit adjusts the input voltage from the battery voltage to the 3.3V (usually) required by the microcontroller. The voltage regulator circuit also contains a diode to make sure that the microcontroller can draw power from the PCB element, but the PCB element cannot draw power from the microcontroller. This is necessary because the microcontroller may have a programming port which can provide power, but the PCB element should not be able to draw power from the microcontroller, as it may require more than the microcontroller can provide.

How the Battery is Housed in the Bag (Carrying Apparatus)

Figure 14:
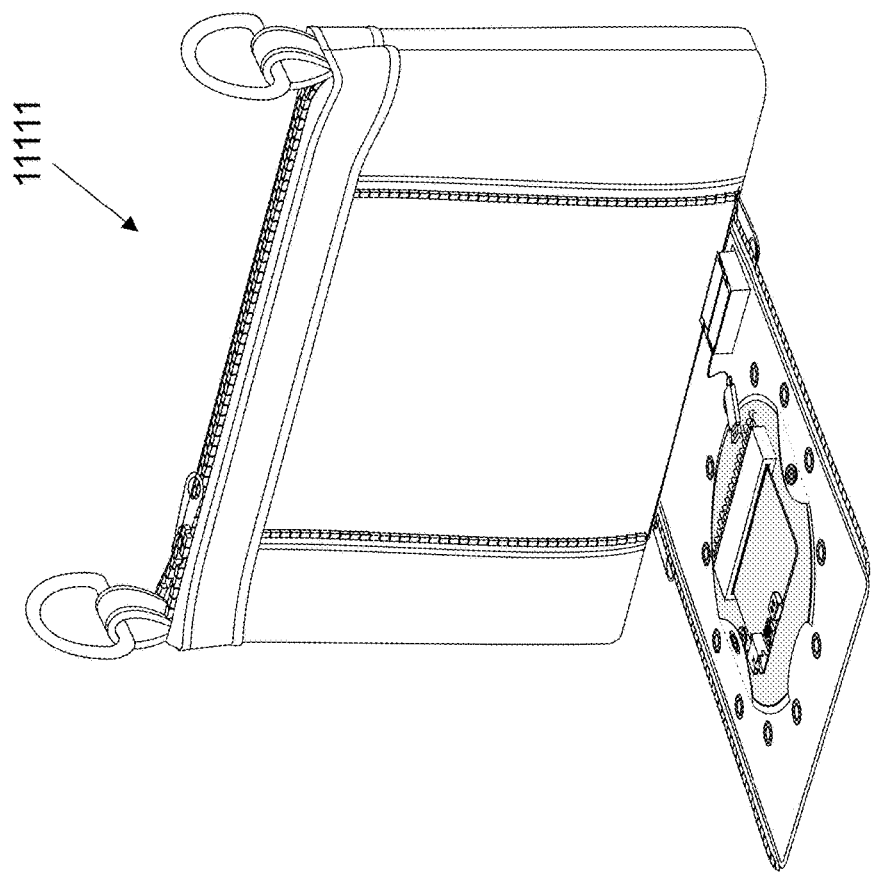
FIG. 14: illustrates a perspective view of the embodiment (11111) of the present invention, the embodiment (11111) is bag having a front panel and the front panel having a compartment, and the front panel having a PCB board and is in an open configuration, in accordance with the aspects of the present invention.
Figure 17:
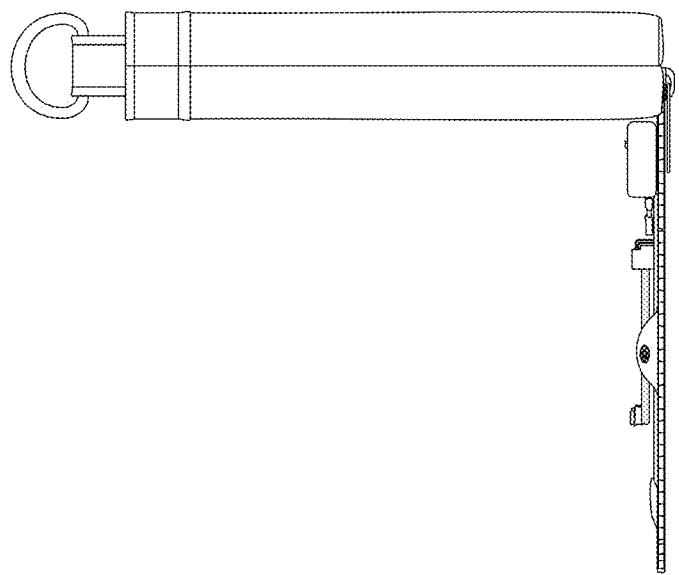
FIG. 17: illustrates a right view of the embodiment (11111) of FIG. 13 of the present invention, in accordance with the aspects of the present invention.
Figure 16:
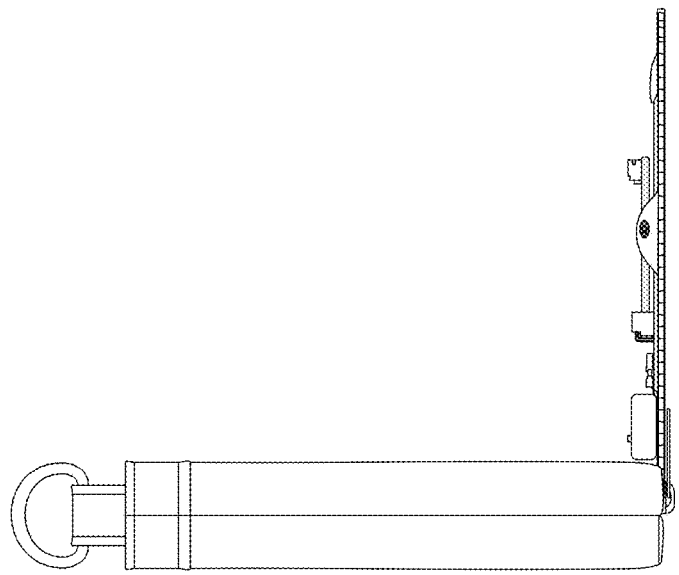
FIG. 16: illustrate a left view of the embodiment (11111) of FIG. 13 of the present invention, in accordance with the aspects of the present invention.
Figure 21:
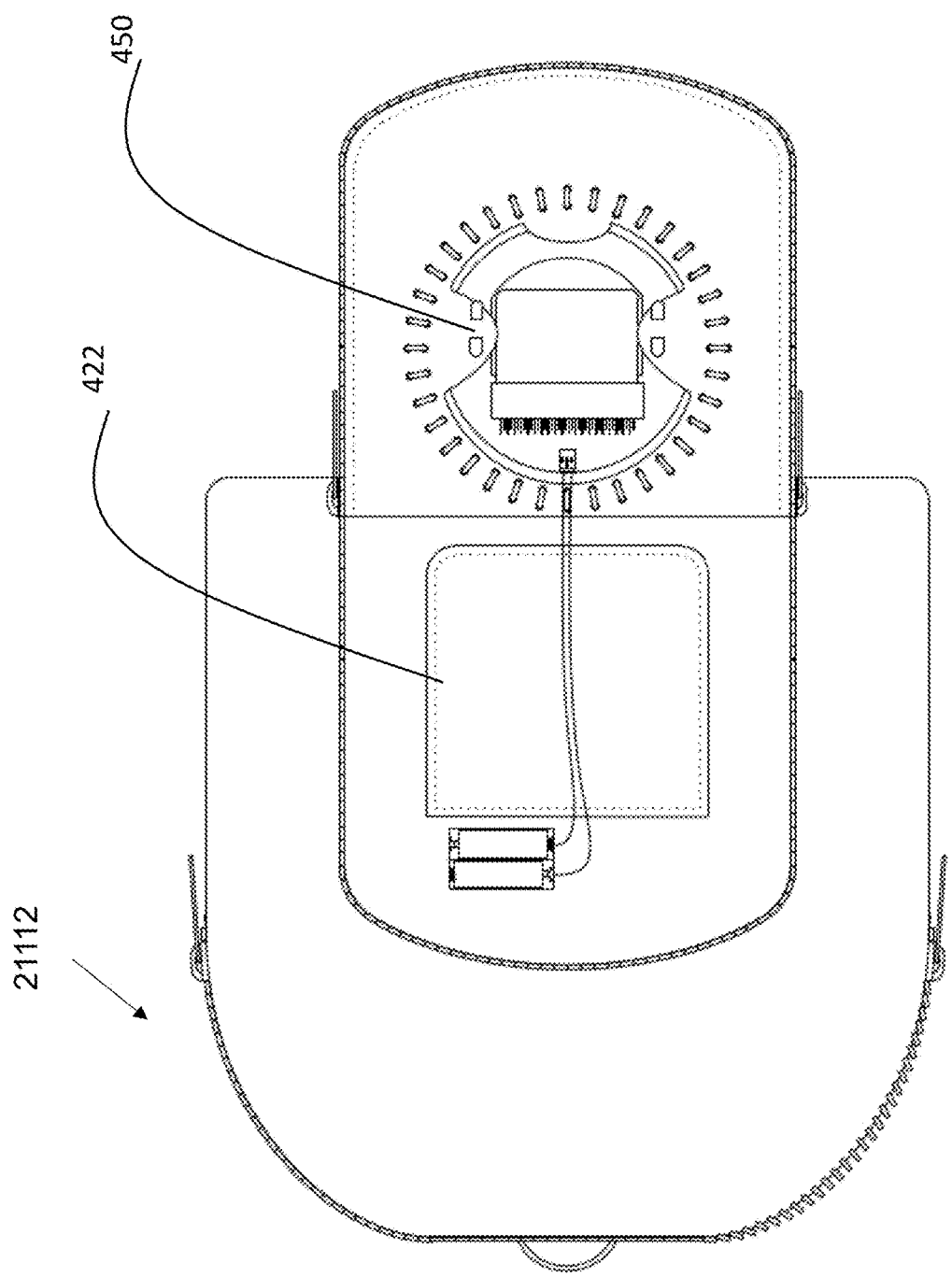
FIG. 21: illustrates a top view of the embodiment (21112) of the present invention, wherein the stitching lines are used to secure two layers of front panel and the backpack is lied on the support and front panel is opened at 180 degrees with respect to the front surface of the backpack, in accordance with the aspects of the present invention.

The battery (or battery pack) is placed in close proximity with the PCB assembly. Preferably, the battery pack is secured, for example on the interior surface of the flat compartment, to avoid random movement that can cause strain on the wires connecting the battery pack to the PCB assembly. In one example, the battery pack is placed near the bottom edge of the flat compartment, as shown in FIGS. 14 and 18. In another example, as shown in FIG. 21, the battery pack is positioned more near the top edge of the flat compartment, rather than near the bottom edge of the flat compartment. The location of the battery pack is specifically made in order not to affect the overall appearance of the handbag or backpack both when the LEDs are on and off.

In one example an additional pocket on the interior surface of the flat compartment is provided, to secure the battery in place. In an alternative example, an additional pocket on a surface opposing to the interior surface of the flat compartment is provided. In still another alternative example, a loop of Velcro or some material and structure equivalent thereof, is configured to hold the weight and avoid movement of the battery pack.

In accordance with the teachings of the present invention, disclosed herein, the two-component intelligent portable carrying apparatus, in a fifth aspect of variations of the modular system, the interior surface of the flat compartment is can be either connected or not connected to the interior wall of the portable carrying apparatus. The interior surface of the flat compartment is secured to the exterior surface of the flat compartment by means of a positioning element, which configured to substantially eliminate the relative displacement between the exterior surface and interior surface of the flat compartment.

In one embodiment of the fifth aspect of variations of the modular system, the positioning element to secured the exterior surface and interior surface of the flat compartment is stitches. The stitches may be arranged in a simple or an artistic, random or regular layout to add aesthetic value. Referring to FIG. 19 and FIG. 20, functionally, stitches 600 are used to secure the exterior surface and interior surface of the flat compartment together. Aesthetically, the stitches 600, on the inside and outside give a very organized and clean look. Additionally, the stitches are arranged around the first plurality of the orifices in a same display arrangement of the first arrangement to complement and enhance the value of the visual effect, especially when the LEDs are off.

In one embodiment of the fifth aspect of variations of the modular system, the positioning element to secure the exterior surface and interior surface of the flat compartment is a hardware assembled around pre-punched holes. According to FIG. 12 and FIG. 13, eyelet design is used. The two-component eyelet design comprises a stem inserted into holes of exterior surface of bag and an eyelet cover is to reinforce the hole or as shield objects from the sharp edges of the hole. Additionally, the eyelet assembly are arranged around the first plurality of the orifices in a same display arrangement of the first arrangement to complement and enhance the value of the visual effect, especially when the LEDs are off.

According to a second major aspect of the present invention, disclosed herein, is a method of using of the two-component intelligent portable carrying apparatus described above.

In accordance with the teachings of the present invention, disclosed herein, in a seventh branching aspect of variations, the a method of using of the two-component intelligent portable carrying apparatus comprises, providing LEDs in a first arrangement onto a PCB element, placing a PCB assembly into a modular system, wherein PCB element connects, regulates and transforms power input from a power supply, and distributes it to the individually addressable LEDs and a programmable control element; and the PCB element provides a connection for data signals to travel from the programmable control element to the individually addressable LEDs. In one example, the programmable control element is a microcontroller.

Further, a power source supplies the energy to the microcontroller and LED through the PCB.

Generally, in most embodiments, the method of the using modular system described above further comprising taking input information and sending a control signal to a voltage level shifting circuit of the PCB element by a programmable control element, sending a voltage level shifting circuit output signal to an illuminating element, including a plurality of addressable LEDs. In the present invention, the input information may be generated by a human or computer-generated program, sensor, smart phone or other remote control device. In the present invention, in some examples, the LEDs in the illuminating element are linked sequentially whereas in another examples, the LEDs in illuminating element are linked in parallel.

Additionally, or preferably, in some embodiments, the PCB element further comprises sensors. Correspondingly, the method further comprises a step of detecting information from the environment by a sensor or sensors on the PCB and sending the information to the programmable control element and subsequently the level shifting circuit of the PCB element.

Alternatively, or optionally, in some embodiments, the programmable control element further comprises sensors. Correspondingly, the method further comprises a step of detecting information from the environment by a sensor or sensors on the programmable control element and sending the information to the programmable control element then subsequently to the level shifting circuit of the PCB element.

How the Electrical/Illumination Components Work Together Via Control Signals

The illumination components (LEDs) are individually addressable and connected to each other in a sequence that passes the control signal from one LED to the next one in the sequence. These signals determine the color and brightness of each LED. These properties of the LEDs may change in response to the control signal sent to the LEDs by the microcontroller (programmable control circuit).

The control signal from the microcontroller enters the PCB via the first connector. It then passes through a level shifting circuit that will amplify the signal voltage if necessary. From the level shifting circuit, the signal goes to the first LED which then passes the instructions to the second LED in the chain and so on until the last LED in the chain is reached. The microcontroller signals determine the color and brightness of the LEDs. The microcontroller may send signals in response to external inputs detected by its sensors or in response to commands from a smartphone or computer communicating via Bluetooth or Wi-Fi, or it may send signals at specific intervals dictated by a computer program it is running.

Figure 32:
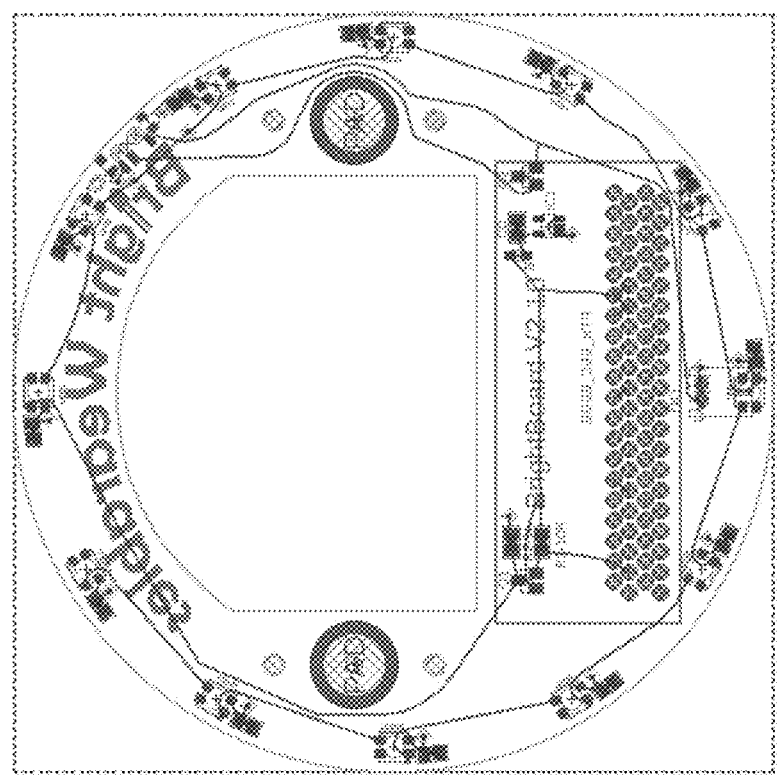
FIG. 32: illustrates front view of electrical and signal connections inside the PCB board as a line drawing.
Figure 31:
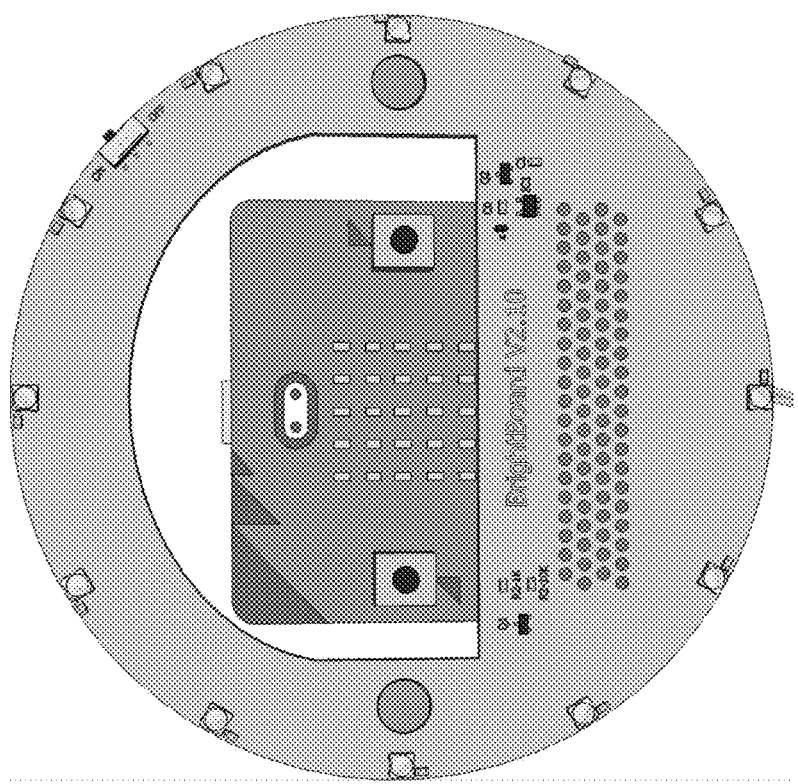
FIG. 31: illustrates front view of a PCB board and a microcontroller PCB assembly including electrical and signal connections.
Figure 36:
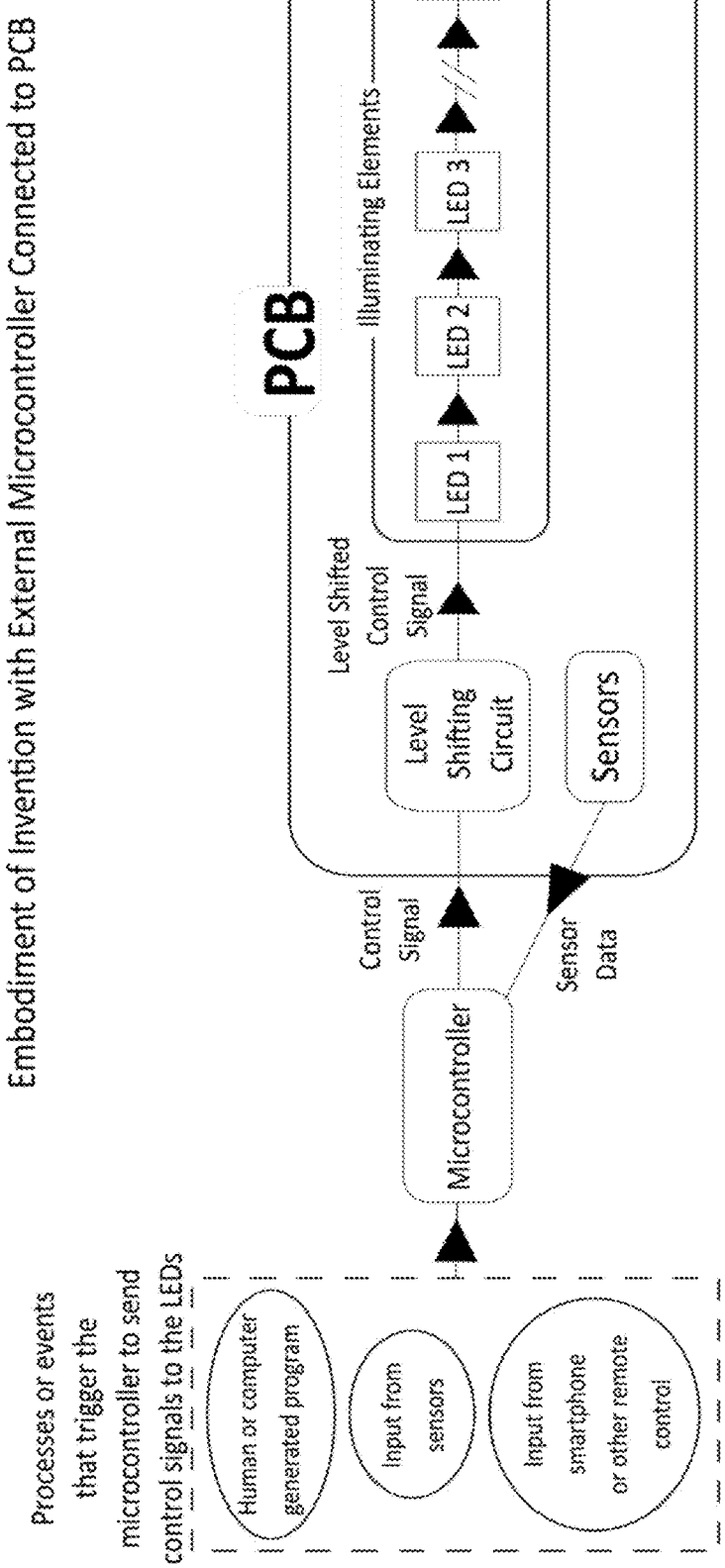
FIG. 36: illustrates one embodiment of method of using and how signals propagate between an external microcontroller, sensors and LEDs.
Figure 37:
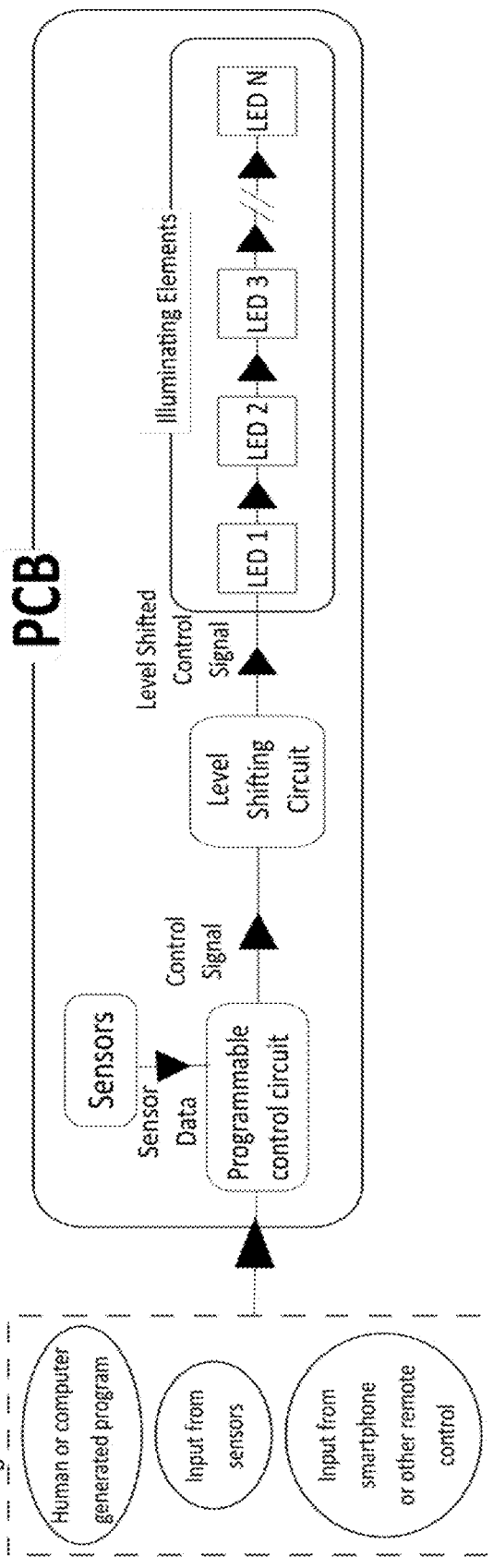
FIG. 37: illustrates one embodiment of method of using and how signals propagate between a programmable microcontroller, sensors and LEDs.

FIGS. 36 and 37 are illustrations of how the signals propagate between the microcontroller, PCB elements and LEDs. The first illustration in FIG. 36 shows signal propagation if the microcontroller is external to the PCB and the second illustration shows signal propagation if the controller (programmable control circuit) is embedded within the PCB. after the microcontroller sending control signal operable instructions to level shifting circuit of the PCB element, level shifted control signal is subsequently sent to the illumination elements. Referring to FIG. 32 and FIGS. 36 and 37, if the number of the LEDs are from 1 to integer n, then the instructions are sent sequentially from the first LED to the nth LED. However, this should not be construed as a limitation, a variety or combined signal transfer pathway are applicable within the illumination elements.

According to a third primary aspect of the present invention, disclosed herein, is a method of interacting with the two-component intelligent portable carrying apparatus described above. In general, a user may interact with the PCB assembly in the two-component intelligent portable carrying apparatus in two primary ways. In one embodiment of the third aspect of the present invention, the method how a user interacts with the portable carrying apparatus is by programming the microcontroller. In another embodiment of the third aspect of the present invention, the method how a user interacts with the portable carrying apparatus is by interacting directly with any sensors contained on the microcontroller or PCB. The interaction method offered by the present invention allows a user to adjust illumination patterns/colors/brightness of the LEDs in the illumination elements.

As it is described above, one embodiment of the present invention includes a modular system comprising the PCB assembly having a PCB element, an detachable microcontroller and a power source, for example a battery assembly. In another embodiment, alternatively, the microcontroller in the above embodiment is replaced by a programmable control circuit built-in within in the PCB element.

In accordance with the teachings of the present invention, disclosed herein, in an eighth branching aspect of variations, a method for a user to interact with the of using the two-component intelligent portable carrying apparatus is disclosed.

One step of the method of interacting includes that the user may turn the device on or off by a power switch in the PCB. When the device is turned off, the LEDs will not provide illumination.

The output of the two-component intelligent portable carrying apparatus is the different colors, patterns and brightness levels exhibited by the LEDs. These properties may change over time, controlled by programs running on the microcontroller. The programs on the microcontroller may simply change with time or respond to information detected by sensors located on either the microcontroller or PCB element. The program on the PCB element may be changed by the user with a connection to a computer or smartphone via cable or wireless interaction, like Bluetooth or WiFi.

How a User Can Interact with the Device to Change the Illumination Patterns

In accordance with the embodiments of the present invention, the user may interact with the apparatus in two primary ways, either by programming the microcontroller; or interacting directly with any sensors contained on the microcontroller or PCB element. This method of interaction requires that the microcontroller is running a program that specifies exactly how data from the sensors changes the illumination patterns of the LEDs, wherein optionally, sensors may be provided for either the microcontroller or the PCB element.

Figure 39:
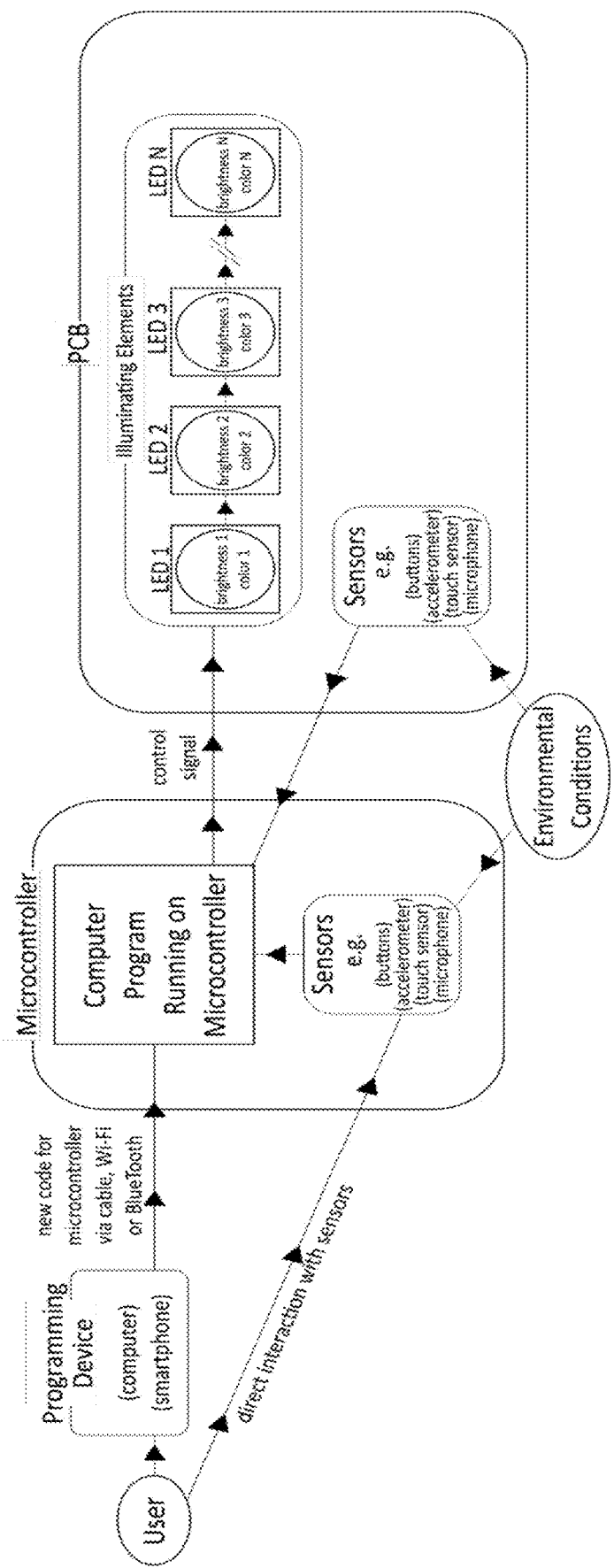
FIG. 39: illustrates a user interaction with the programmable LED system to change the pattern of the LEDs and wherein, a program controlling the LED patterns runs on a microcontroller which is separate from the PCB.
Figure 40:
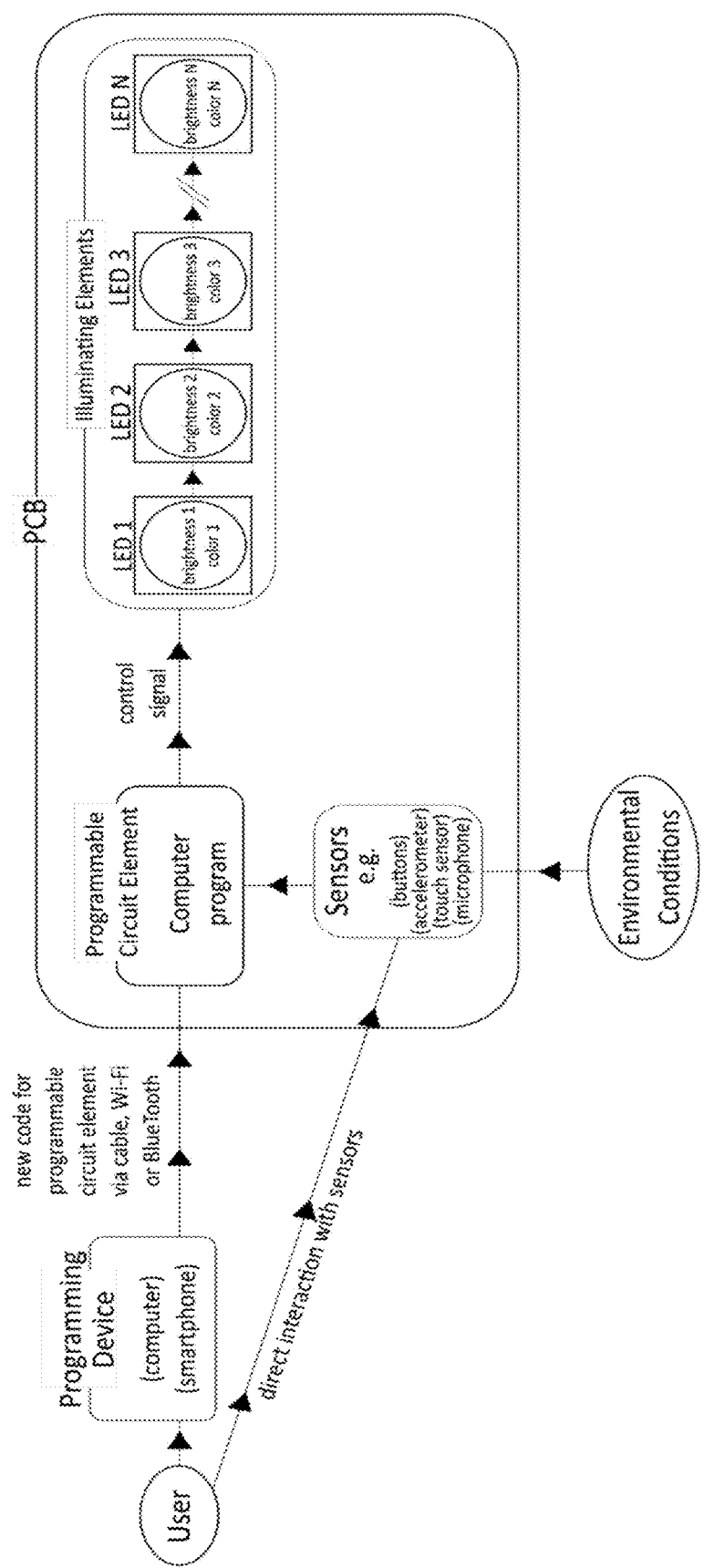
FIG. 40: illustrates a user interaction with the programmable LED system to change the pattern of the LEDs, wherein the program controlling the LED patterns runs on a programmable circuit element which is part of the PCB.

The ways in which user interaction with the apparatus may change the illumination patterns/colors/brightness is shown in the diagrams in FIG. 39 and FIG. 40. The process flow diagram depicted in FIG. 39 embodies a version of the apparatus wherein the microcontroller is separate from the PCB element and the process flow diagram depicted in FIG. 40 embodies a version of the apparatus where the microcontroller circuit is embedded within the PCB element.

Another step of the method of interacting includes a user interacting with a programming device to send new code to microcontroller via cable, Wi-Fi or blue tooth; the microcontroller sequentially sending control signal to illuminating elements in the PCB element; the microcontroller taking input from sensors detecting environmental condition information; wherein the sensors are either built in within the microcontroller or built in within the PCB element.

Optionally, in one variation, the microcontroller is built into the PCB element.

In some variations, alternatively, another step of the method of interacting includes a user interacting directly with sensors in the apparatus. The sensors are placed either in the PCB assembly, on the PCB element or on the microcontroller. In some embodiments, the sensors are configured to take input from environmental conditions.

How a User May Create Code to Run on the Microcontroller

In accordance with the teachings of the present invention, disclosed herein, in an eighth branching aspect of variations, a method for a user to interact with the apparatus is that a user may create code to run on a microcontroller through an application running in a web browser or on an app that is installed on a computer or smartphone.

Figure 41:
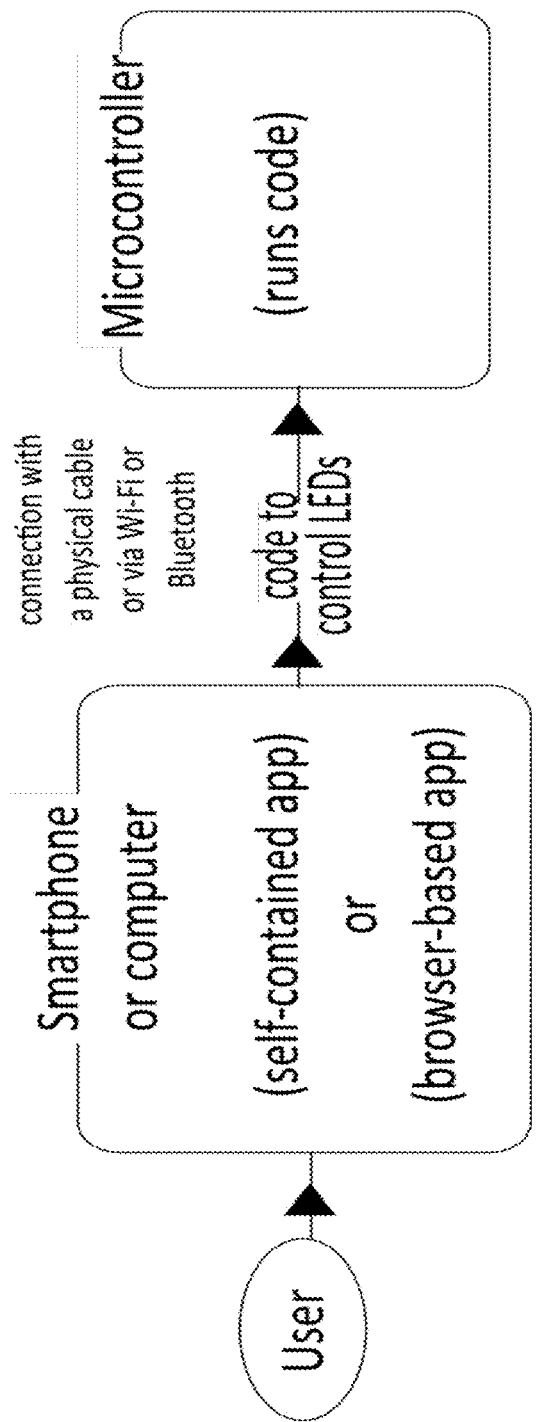
FIG. 41 is a process flow diagram to illustrate how instructions flow from a user to a microcontroller.
Figure 42B:
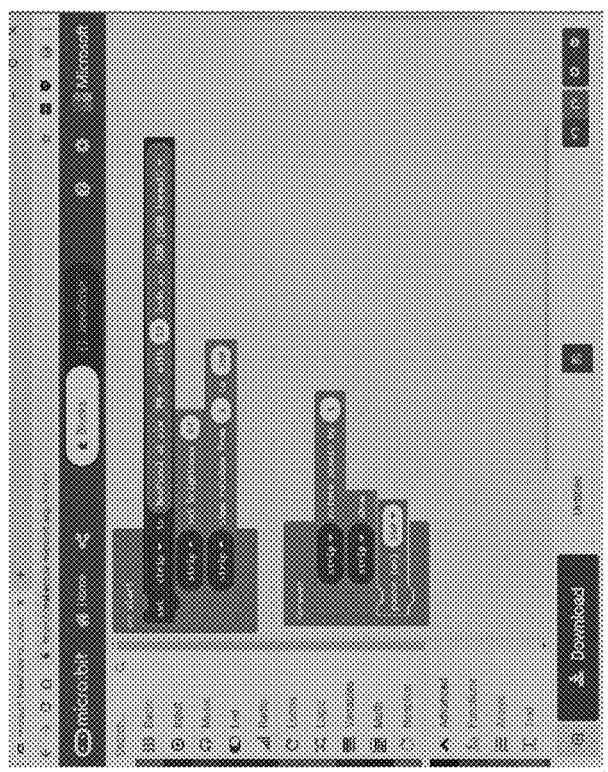
FIG. 42*a* and FIG. 42*b* show a user interface for creating code for the microcontroller to display LED patterns.
Figure 42A:
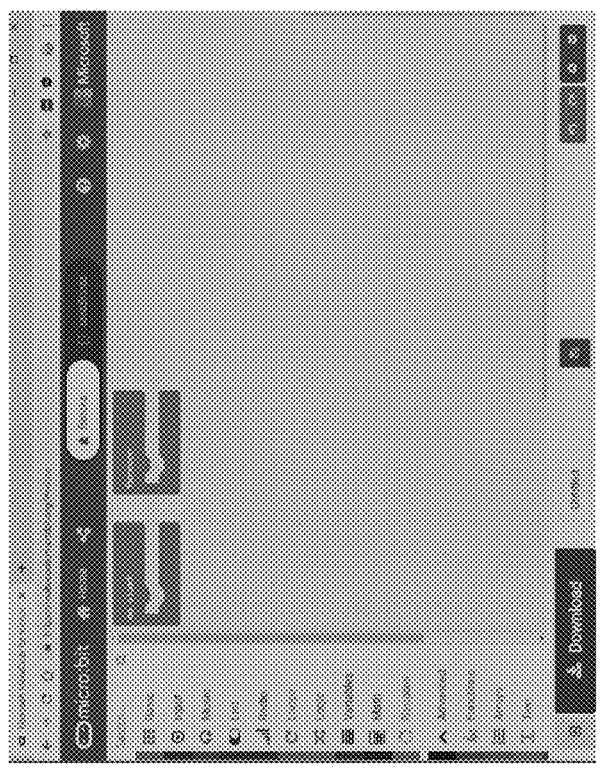

A coding app may be text-editor based, or use drag- and drop-blocks to generate code. FIG. 41 illustrate a very simple example of a flow chart for the user coding the microcontroller. One example is the Microsoft MakeCode editor (available online at https://makecode.microbit.org/#editor) which can be used to program a BBC micro:bit microcontroller from a web browser. The MakeCode website uses drag-and-drop blocks to generate a program.

In a first example of the steps to program a micro:bit microcontroller with the Microsoft MakeCode app:

1) On a computer, the user opens a Chrome web browser and navigates to https://makecode.microbit.org/#editor which opens an online editor window shown below. The colored menus on the left contain code blocks with different functions.
2) The user assembles a program by dragging and dropping code blocks from the menus at left. The "Neopixel" menu specifically contains code blocks that allow the micro:bit to change the color and brightness of the LEDs on the PCB.
3) The user then connects the micro:bit to the computer with a USB cable and presses the "download" button on the editor web page. This loads the code onto the micro:bit.
4) If the micro:bit is connected to the PCB and the power is turned on, the code will cause a rainbow to display on the micro:bit. The code specifies that every 100 ms, the colors of the LEDs will shift by one step in the sequence, resulting in a rainbow display that moves around the LEDs.

In a second example of the steps to program a microcontroller, a web-based drag-and-drop code generator called Brightly is used. It has built-in functions that create LED patterns and sequences for microcontrollers which run the CircuitPython programming language (e-microcontrollers like the Adafruit Gemma M0, Adafruit Trinket M0 Adafruit CircuitPlayground Express . . . ) It can be found online at. https://brightwearables.com/brightly/index.html FIG. 43a shows there is a standard code editor windows with menus at the left FIG. 43b shows some of the code blocks allow a user to specify a color for each individual LED by clicking on it and selecting a color option. FIG. 43c shows other code blocks will generate a pattern or sequence. The last two code blocks below (a) scroll a pattern in Morse code around the LEDs and (b) twinkle a specified number of LEDs in a specified color for a particular amount of time.

FIG. 43d shows the code blocks can be assembled in sequence to run repeatable patterns on the LEDs in the PCB. Once the program is specified, a user clicks the "download code" link in the browser and a python code file is downloaded to the computer. This python code file is then copied to the microcontroller (by connecting the microcontroller to the computer with a cable saving it to the microcontroller which appears as a drive). When the microcontroller is connected to the PCB, and the power is turned on, the colors and sequences specified in the program will display on the LEDs.

The elements in the Figures are:
101—a front panel
102—a left side edge of the front panel
104—a right side edge of the front panel
106—a bottom edge of the front panel
201—a back panel
202—a left side edge of the back panel
204—a right side edge of the back panel
206—a bottom edge of the back panel
301—a left side panel
302—a right side panel
303—a bottom panel
304—a first connecting member
305—a second connecting member
401—flat compartment
402—exterior surface of the flat compartment
403—a first edge, or a top edge of the exterior surface of the flat compartment
404—a second edge, or a left edge of the exterior surface of the flat compartment
405—a third edge, or a right edge of the exterior surface of the flat compartment
406—a fourth edge, or a bottom edge of the exterior surface of the flat compartment
412—interior surface of the compartment
413—a first edge, or a top edge of the interior surface of the flat compartment
414—a second edge, or a left edge of the interior surface of the flat compartment
415—a third edge, or a right edge of the interior surface of the flat compartment
416—a fourth edge, or a bottom edge of the interior surface of the flat compartment
417—a cavity of the interior surface
418—a first flap member
419—a second flap member
420—a third flap member
422—a surface of lining of the bag, for example opposing of the interior surface of the compartment
430—one example of a first attachment element
431, 432—a complimentary pair of male or female joint elements in the first attachment element
440—one example of a second attachment element
441, 442—a complimentary pair of male or female joint elements in the second attachment element
450—another example of the first attachment element
500—positioning element to allow precise alignment between interior and exterior surface, eyelets
510—a plurality of orifices in a first display arrangement as LED windows
512—a plurality of orifices in a second display arrangement as LED windows
513—a plurality of orifice(s) in a third display arrangement an LED windows or windows
600—positioning element to allow precise alignment between interior and exterior surface, stiches
699—a PCB assembly
700—a PCB element
701—a first example of PCB
702—a second example of PCB
703—a third example of PCB
704—microcontroller
705—battery assembly
710—a LED array in a first arrangement matching orifices in a first display arrangement
712—a LED array in a second arrangement matching orifices in the second display arrangement
714—a LED array in a third arrangement matching orifices in the third display arrangement
724—a power switch
725—individually addressable LEDs
726—power regulation
727—level shifter circuit for microcontroller signal
728—a first electrical connector on the PCB for the microcontroller
729—a second electrical connector on the PCB for the battery or battery assembly The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to explain the principles of the invention and its practical applications, they thereby enable others skilled in the art to utilize the invention and various embodiments with various modifications as are suited to the particular use contemplated. It is intended that the following claims and their equivalents define the scope of the invention.

The invention claimed is:

1. A two-component intelligent portable carrying apparatus, comprising:
   a portable carrying apparatus comprising one or more interior walls and one or more exterior walls,
      wherein the interior walls are connected to form a semi-enclosed area, having a top or side opening, and the carrying apparatus is configured to contain items;
   a flat compartment, being provided with the carrying apparatus,
      the flat compartment has an exterior surface and interior surface, configured to receive a detachable Printed Circuit Board (PCB) assembly between the exterior and interior surfaces, and the flat compartment being configured to be flat when the detachable Printed Circuit Board (PCB) assembly is placed in;
      wherein the exterior surface,
         has a first edge, a second edge, a third edge and a fourth edge, the four edges are connected together circumferentially to define the exterior surface of the flat compartment;
         the exterior surface of the flat compartment is permanently fixed to one of the exterior walls of the portable carrying apparatus by the fourth edge;
         the second edge of the flat compartment is releasably attached to the one of the exterior walls of the portable carrying apparatus by means of a first connecting member,
         the third edge of the flat compartment is releasably attached to one of the exterior walls of the portable carrying apparatus by means of a second connecting member,
         wherein the first connecting member and the second connecting member are configured to allow the exterior surface of the flat compartment to form an adjustable angle with one of the exterior walls of the portable carrying apparatus, intermittently or continuously at least between 0-180 degrees,
   a plurality of orifices, provided for the exterior surface of the flat compartment, and adapted to receive or expose surface features of the PCB assembly, wherein said surface features are selected from a plurality of LEDs disposed on a first surface of a PCB board,
   wherein the interior surface of the flat compartment comprises
      a cavity to accommodate the Printed circuit board (PCB) element in the PCB assembly;
      wherein the PCB element is secured in the flat compartment by means of a first attachment member and a second attachment member,
         both having complimentary joining members on a second surface of the PCB element and the interior surface of the flat compartment;
   the PCB assembly, comprising
      the PCB element, having the plurality of LEDs in a first arrangement, a detachable programmable control element or a built-in programmable control element, and configured to send operable instructions to the LEDs on the PCB board; and
      a detachable battery assembly connected a connection on the PCB element.

2. The two-component intelligent carrying apparatus of claim 1, wherein said carrying apparatus is a handbag.

3. The two-component intelligent carrying apparatus of claim 1 wherein said carrying apparatus is a backpack.

4. The two-component intelligent carrying apparatus of claim 1, wherein the interior surface of the flat compartment is connected to one of the interior walls of the portable carrying apparatus.

5. The two-component intelligent carrying apparatus of claim 1, wherein the interior surface of the flat compartment is not connected to the interior wall of the portable carrying apparatus, but the interior surface of the flat compartment is secured to the exterior surface of the flat compartment by means of a positioning element, which is configured to substantially eliminate the relative displacement between the exterior surface and interior surface of the flat compartment.

6. The two-component intelligent carrying apparatus of claim 1, further comprising first and second flap members provided along an edge of the cavity, wherein the flap members are flexible and configured to cover the PCB element partially when it is disposed in the flat compartment.

7. The two-component intelligent carrying apparatus of claim 5, wherein the positioning element is selected from stiches or hardware that are pressed together through pre-punched holes.

8. The two-component intelligent carrying apparatus of claim 1, wherein the built-in programmable control element means a programmable chip built-in within the PCB element.

9. The two-component intelligent carrying apparatus of claim 1, wherein the PCB element is configured to be connected to more than one kind of programmable control element.

10. The two-component intelligent carrying apparatus of claim 1, wherein the PCB board further includes one or more sensors, selected from push-buttons, linear or circular potentiometers, accelerometer, gyroscope, IMU [inertial measurement unit], temperature sensor, capacitive touch sensor, microphone, color sensor, light sensor, camera, gesture sensor.

11. The two-component intelligent carrying apparatus of claim 1, wherein the LEDs are RGB LEDs configured to display customizable colors/patterns in response to modifiable computer code.

12. The two-component intelligent carrying apparatus of claim 1, wherein the PCB board can receive signals from another two-component intelligent carrying apparatus.

13. The two-component intelligent carrying apparatus of claim 1, wherein the PCB board includes another plurality of LEDs disposed on a microcontroller of the PCB assembly, and push buttons on the microcontroller of the PCB assembly.

14. The two-component intelligent carrying apparatus of claim 13, wherein the microcontroller is selected from (i) the BBC micro:bit (ii) Wemos DI Mini Pro (esp8266 board) (iii) Gemma M0 (CircuitPython programmable Board) (iv) Adafruit Circuit Playground (v) Wemos Lolin D32.

15. The two-component intelligent carrying apparatus of claim 1, wherein the first connecting member and second connecting member are positioned parallel to each other.

16. The two-component intelligent carrying apparatus of claim 1, wherein the first connecting member and second connecting member are zippers.

17. The two-component intelligent carrying apparatus of claim 1, wherein the plurality of LEDs in the first arrangement are arranged in a pattern around a circular edge of the PCB board.

18. The two-component intelligent carrying apparatus of claim 13, wherein the plurality of LEDs in the second arrangement are arranged in an array having rows and columns disposed in a center of the microcontroller.

19. The two-component intelligent carrying apparatus of claim 1, wherein said carrying apparatus weighs between 4 oz to 10 lbs.

20. The two-component intelligent carrying apparatus of claim 16, wherein the first connecting member and second connecting member are integrated into one zipper.

21. A method of using of a two-component intelligent portable carrying apparatus,
comprising,
providing a plurality of individually addressable LEDs in a first arrangement onto a PCB element,
placing a PCB assembly including the PCB element, a power supply and a programmable control element, into a modular system, wherein the PCB element connects, regulates and transforms power input from the power supply, and distributes it to the individually addressable LEDs and the programmable control element; and the PCB element provides a connection for data signals to travel from the programmable control element to the individually addressable LEDs;
securing the PCB element to the two-component intelligent portable carrying apparatus through a flat compartment by means of a first attachment member and a second attachment member, both having complimentary joining members on a surface of the PCB element and an interior surface of the flat compartment of the portable carrying apparatus.

22. The method of using of claim 21, further comprising taking input information and sending control signals to a level shifting circuit of the PCB element, by the programmable control element; and
sending level shifted circuit output signals from the level shifting circuit to illuminating elements including the plurality of LEDs, and adjusting illumination pattern, color, illumination level and illumination time of the LEDs accordingly.

23. The method of using of claim 22, wherein the input information includes instructions or information from sensors on the PCB element, processes, or events including human or computer-generated program, input from sensors, and input from smart phone or other remote control, and wherein the PCB element is capable of accepting or connecting to two different microcontrollers.

\* \* \* \* \*